United States Patent
Lee et al.

(10) Patent No.: US 12,461,438 B2
(45) Date of Patent: Nov. 4, 2025

(54) BLANK MASK AND PHOTOMASK USING THE SAME

(71) Applicant: SK enpulse Co., Ltd., Pyeongtaek-si (KR)

(72) Inventors: Hyung-joo Lee, Suwon-si (KR); Jiyeon Ryu, Suwon-si (KR); Kyuhun Kim, Suwon-si (KR); Inkyun Shin, Suwon-si (KR); Seong Yoon Kim, Suwon-si (KR); Suk Young Choi, Suwon-si (KR); Suhyeon Kim, Suwon-si (KR); Sung Hoon Son, Suwon-si (KR); Min Gyo Jeong, Suwon (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 341 days.

(21) Appl. No.: 17/567,478

(22) Filed: Jan. 3, 2022

(65) Prior Publication Data
US 2022/0206380 A1    Jun. 30, 2022

(30) Foreign Application Priority Data

Dec. 31, 2020  (KR) .................. 10-2020-0189814
Dec. 31, 2020  (KR) .................. 10-2020-0189912
(Continued)

(51) Int. Cl.
*G03F 1/32*    (2012.01)
(52) U.S. Cl.
CPC ..................... *G03F 1/32* (2013.01)
(58) Field of Classification Search
CPC ................................................ G03F 1/26–32
See application file for complete search history.

(56) References Cited

U.S. PATENT DOCUMENTS 6,132,576 A    10/2000  Pearson
6,666,957 B2   12/2003  Watanabe et al.
(Continued)

FOREIGN PATENT DOCUMENTS

CN    108957914 A    12/2018
CN    110651225 A    1/2020
(Continued)

OTHER PUBLICATIONS

Korean Decision to Grant a Patent issued on Dec. 24, 2021 in counterpart Korean Patent Application No. 10-2020-0189912 (6 pages in Korean).
(Continued)

*Primary Examiner* — Martin J Angebranndt
(74) *Attorney, Agent, or Firm* — NSIP Law

(57) ABSTRACT

The present disclosure relates to a blank mask and the like, and comprises a transparent substrate, a phase shift film disposed on the transparent substrate, and a light shielding film disposed on the phase shift film. The blank mask has a TFT1 value of 0.25 µm/100° C. or less expressed by Equation 1 below:

$$TFT1 = \frac{\Delta PM}{T2 - T1} \quad \text{[Equation 1]}$$

where, when the thermal variation of the processed blank mask, which is formed by processing the thickness of the transparent substrate of the blank mask to be 0.6 mm and removing the light shielding film, is analyzed in a thermomechanical analyzer, the measuring temperature of the thermomechanical analyzer is increased from T1 to T2, and ΔPM is a position change of the upper surface of the phase shift film in the thickness
(Continued)

direction at T2, based on a position of the upper surface of the phase shift film at T1.

15 Claims, 15 Drawing Sheets

(30) Foreign Application Priority Data

Feb. 25, 2021 (KR) .......................... 10-2021-0025946
Mar. 31, 2021 (KR) .......................... 10-2021-0041895

(56) References Cited

U.S. PATENT DOCUMENTS

| | | | |
|---|---|---|---|
| 2002/0061452 A1 | 5/2002 | Nozawa et al. | |
| 2004/0015537 A1 | 1/2004 | Doerksen et al. | |
| 2005/0095730 A1 | 5/2005 | Mikami | |
| 2005/0260505 A1* | 11/2005 | Fukushima | G03F 1/32 |
| | | | 430/323 |
| 2011/0236604 A1 | 9/2011 | Fujiwara et al. | |
| 2013/0288163 A1* | 10/2013 | Fukaya | G03F 1/32 |
| | | | 430/5 |
| 2015/0286132 A1 | 10/2015 | Sakai et al. | |
| 2015/0338731 A1 | 11/2015 | Nozawa et al. | |
| 2016/0291451 A1* | 10/2016 | Nam | G03F 1/58 |
| 2016/0377975 A1 | 12/2016 | Matsumoto et al. | |
| 2017/0139316 A1 | 5/2017 | Shishido et al. | |
| 2018/0149961 A1* | 5/2018 | Nozawa | G03F 1/54 |
| 2018/0210331 A1 | 7/2018 | Kajiwara et al. | |
| 2018/0252995 A1 | 9/2018 | Matsumoto et al. | |
| 2022/0214609 A1* | 7/2022 | Lee | G03F 1/26 |
| 2022/0244630 A1 | 8/2022 | Nakagawa et al. | |

FOREIGN PATENT DOCUMENTS

| | | | | |
|---|---|---|---|---|
| CN | 111247457 | A | 6/2020 | |
| CN | 111758071 | A | 10/2020 | |
| CN | 113073297 | A | 7/2021 | |
| JP | 60-140347 | A | 7/1985 | |
| JP | 7-43733 | A | 2/1995 | |
| JP | 7-159972 | A | 6/1995 | |
| JP | 2002-162726 | A | 6/2002 | |
| JP | 2005-83834 | A | 3/2005 | |
| JP | 2006-93633 | A | 4/2006 | |
| JP | 2006-276648 | A | 10/2006 | |
| JP | 2008-240087 | A | 10/2008 | |
| JP | 4306958 | B2 | 8/2009 | |
| JP | 4319989 | B2 | 8/2009 | |
| JP | 2010-39300 | A | 2/2010 | |
| JP | 2011-95787 | A | 5/2011 | |
| JP | 2011-112824 | A | 6/2011 | |
| JP | 5409298 | B2 | 2/2014 | |
| JP | 2016-20949 | A | 2/2016 | |
| JP | 2016-45233 | A | 4/2016 | |
| JP | 2018-54836 | A | 4/2018 | |
| JP | 2018-159961 | A | 10/2018 | |
| JP | 2018-165817 | A | 10/2018 | |
| JP | 2019066892 | A * | 4/2019 | ............... G03F 1/26 |
| JP | 6679262 | B2 | 4/2020 | |
| JP | 2020-144358 | A | 9/2020 | |
| KR | 10-0720334 | B1 | 5/2007 | |
| KR | 10-2008-0059614 | A | 6/2008 | |
| KR | 10-0869268 | B1 | 11/2008 | |
| KR | 10-0890409 | B1 | 3/2009 | |
| KR | 10-2009-0050496 | A | 5/2009 | |
| KR | 10-2011-0044106 | A | 4/2011 | |
| KR | 10-2012-0134493 | A | 12/2012 | |
| KR | 10-2013-0132925 | A | 12/2013 | |
| KR | 10-1360540 | B1 | 2/2014 | |
| KR | 10-1439877 | B1 | 9/2014 | |
| KR | 10-1504557 | B1 | 3/2015 | |
| KR | 10-2015-0107787 | A | 9/2015 | |
| KR | 10-2016-0022767 | A | 3/2016 | |
| KR | 10-2016-0096727 | A | 8/2016 | |
| KR | 10-2016-0117243 | A | 10/2016 | |
| KR | 10-2016-0141720 | A | 12/2016 | |
| KR | 10-2018-0026766 | A | 3/2018 | |
| KR | 10-2019-0008110 | A | 1/2019 | |
| KR | 102273211 | B1 * | 7/2021 | |
| KR | 10-2368448 | B1 | 2/2022 | |
| KR | 10-2400199 | B1 | 5/2022 | |
| TW | 201137511 | A1 | 11/2011 | |
| TW | 201800834 | A | 1/2018 | |
| TW | I612374 | B | 1/2018 | |
| TW | 201937267 | A | 9/2019 | |
| TW | 1673563 | B | 10/2019 | |
| TW | 202040261 | A | 11/2020 | |
| WO | WO 97/04360 | A1 | 2/1997 | |
| WO | WO 2007/074806 | A1 | 7/2007 | |
| WO | WO 2009/157506 | A1 | 12/2009 | |
| WO | WO 2020/179463 | A1 | 9/2020 | |
| WO | WO 2020/261986 | A1 | 12/2020 | |

OTHER PUBLICATIONS

United States Office Action Issued on Feb. 13, 2025, in Counterpart U.S. Appl. No. 18/750,609 (15 Pages in English).
Chinese Office Action Issued on Apr. 17, 2025, in Counterpart Chinese Patent Application No. 202111651440.X (5 Pages in English, 5 Pages in Chinese).
Chinese Office Action Issued on May 22, 2025, in Counterpart Chinese Patent Application No. 202111651457.5 (6 Pages in English, 5 Pages in Chinese).
U.S. Final Office Action issued on Jun. 24, 2025, in related U.S. Appl. No. 18/750,609 (20pages).
U.S. Notice of Allowance issued on Sep. 12, 2025, in related U.S. Appl. No. 18/750,609 (9pages).

* cited by examiner

BLANK MASK AND PHOTOMASK USING THE SAME

CROSS-REFERENCE TO RELATED APPLICATIONS

This application claims the benefit under 35 U.S.C. 119(a) of Korean Patent Application No. 10-2020-0189814 filed on Dec. 31, 2020, No. 10-2020-0189912 filed on Dec. 31, 2020, No. 10-2021-0025946 filed on Feb. 25, 2021 and No. 10-2021-0041895 filed on Mar. 31, 2021 in the Korean Intellectual Property Office, the entire disclosure of which is incorporated herein by reference for all purposes.

BACKGROUND

1. Field

The present disclosure relates to a blank mask and a photomask using the same.

2. Description of Related Art

Due to high integration of semiconductor devices or the like, miniaturization of circuit patterns of semiconductor devices is being required. For this reason, the importance of a lithography technique, which is a technique for developing a circuit pattern on a wafer surface using a photomask is being further emphasized.

For developing a miniaturized circuit pattern, an exposure light used in an exposure process (photolithography) is required to having a shortened wavelength. As the exposure light used recently, there is ArF excimer laser (wavelength of 193 nm) or the like.

On the other hand, there are Binary mask, Phase shift mask, and the like as photomasks.

The Binary mask has a structure in which a light shielding pattern layer is formed on a transparent substrate. In a surface where a light shielding pattern is formed from the Binary mask, a transmissive portion not including a light shielding pattern layer allows exposure light to be transmitted, and a light shielding portion including a light shielding pattern layer shields exposure light to transfer a pattern on a resist film of the surface of a wafer. However, the Binary mask may cause a problem in the development of a minute pattern due to diffraction of light occurring at the edge of the transmissive portion as the pattern is being more miniatured.

As a phase shift mask, there are Levenson type, Outrigger type, and Half-tone type. Among the above, Half-tone type phase shift mask has a structure in which a pattern formed with semi-transmissive films is formed on a transparent substrate. In a surface where a pattern is formed from the Half-tone type phase shift mask, a transmissive portion not including a semi-transmissive film allows exposure light to be transmitted, and a semi-transmissive portion including a semi-transmissive film allows attenuated exposure light to be transmitted. The attenuated exposure light is allowed to have a phase difference compared to exposure light which has transmitted the transmissive portion. Accordingly, diffraction light occurring at the edge of the transmissive portion is counteracted by the exposure light which has transmitted the semi-transmissive portion, and thereby the phase shift mask can form a further refined minute pattern on the surface of a wafer.

RELATED PRIOR ART

Patent Document

Korean Patent Registration No. 10-1360540, US Patent Publication No. 2004-0115537 and Japanese Patent Publication No. 2018-054836.

SUMMARY

A blank mask according to one embodiment includes a transparent substrate; a phase shift film disposed on the transparent substrate; and a light shielding film disposed on the phase shift film and has a TF1 value of 0.25 μm/100° C. or less which is expressed by Equation 1 below.

$$TFT1 = \frac{\Delta PM}{T2 - T1} \quad \text{[Equation 1]}$$

Here, when the thermal variation of a processed blank mask, which is formed by processing the thickness of the transparent substrate of the blank mask to be 0.6 mm and removing the light shielding film, is analyzed in a thermomechanical analyzer, the measuring temperature of the thermomechanical analyzer is increased from the T1 to the T2, and the ΔPM is a position change of the upper surface of the phase shift film in the thickness direction at the T2, based on a position of the upper surface of the phase shift film at the T1.

The blank mask may have the TFT1 value of 0.2 μm/100° C. or less when the T1 is 50° C. and the T2 is 80° C.

The blank mask may have the TFT1 value of 0.2 μm/100° C. or less when the T1 is 50° C. and the T2 is 150° C.

The blank mask may have a TFT2 value of 0.25 μm/100° C. or less which is expressed by Equation 2 below.

$$TFT2 = \frac{\Delta PC}{T2 - T1} \quad \text{[Equation 2]}$$

Here, when the thermal variation of a processed blank mask, which is formed by processing the thickness of the blank mask to be 0.6 mm, is analyzed in a thermomechanical analyzer, the measuring temperature of the thermomechanical analyzer is increased from the T1 to the T2, and the ΔPC is a position change of the upper surface of the light shielding film in the thickness direction at the T2, based on a position of the upper surface of the light shielding film at the T1.

The blank mask may have a Photon energy of 1.8 to 2.14 eV in a point having Del_2 value of 0 according to Equation 3 below, when having $PE_1$ value of 1.5 eV and $PE_2$ value of 3.0 eV.

$$\text{Del\_2} = \lim_{\Delta PE \to 0} \left( \frac{\Delta DPS}{\Delta PE} \right) \quad \text{[Equation 3]}$$

In the Equation 3, the DPS value is a value of the phase difference between P wave and S wave of reflected light if the phase difference between P wave and S wave of the reflected light is 180° or less, or a value of subtracting the phase difference between P wave and S wave of the reflected light from 360° if the phase difference between P wave and S wave of the reflected light is more than 180°, when the light shielding film is removed from the blank mask and the surface of the phase shift film is measured with a spectroscopic ellipsometer by applying an incident angle to be 64.5°.

The PE value is a Photon energy of incident light within a range of the $PE_1$ value to the $PE_2$ value.

The blank mask may have a Photon energy of 3.8 eV to 4.64 eV in a point having the Del_2 value of 0, when $PE_1$ value is 3 eV and $PE_2$ value is 5 eV.

The blank mask may have a Photon energy of incident light of 3.8 eV to 4.64 eV in a point having the Del_2 value of 0 which is expressed by Equation 4 below, when $PE_1$ value is 3.0 eV and $PE_2$ value is 5.0 eV.

The blank mask may have a Photon energy of incident light of 1.8 eV to 2.14 eV in a point having the Del_2 value of 0, when the $PE_1$ value is 1.5 eV and the $PE_2$ value is 3.0 eV.

The blank mask may have an average Del_2 value of 78 to 98°/eV, when the $PE_1$ value is 1.5 eV and the $PE_2$ value is the minimum value within Photon energy values of incident light in a point having the Del_2 value of 0.

The blank mask may have an average Del_2 value of −65 to −55°/eV, when the $PE_1$ value is the minimum value within Photon energy values of incident light in a point having the Del_2 value of 0, and the $PE_2$ value is the maximum value within Photon energy values of incident light in a point having the Del_2 value of 0.

The blank mask may have an average Del_2 value of 60 to 120°/eV, when the $PE_1$ value is the maximum value within Photon energy values of incident light in a point having the Del_2 value of 0, and the $PE_2$ value is 5.0 eV.

The blank mask may have a maximum value of Del_2 which is 105 to 300°/eV, when the $PE_1$ value is 1.5 eV and the $PE_2$ value is 5.0 eV.

The blank mask may have a Photon energy of 4.5 eV or more in a point having the maximum value of the Del_2 value.

The phase shift film may comprise a phase difference adjustment layer and a protective layer disposed on the phase difference adjustment layer.

The phase shift film may include a transition metal, silicon, oxygen, and nitrogen.

The phase difference adjustment layer may include nitrogen of 40 to 60 atom %.

The protective layer may include nitrogen in an amount of 20 to 40 atom %.

The protective layer may include a region having a ratio of nitrogen content compared to oxygen content which is 0.4 to 2 in the thickness direction, and the region may have a thickness of 30 to 80% compared to the entire thickness of the protective layer.

The ratio of the thickness of the protective layer compared to the thickness of the phase shift film may be 0.04 to 0.09.

The thickness of the protective layer may be 25 Å to 80 Å.

The phase difference adjustment layer may have a refractive index of 2 to 4 for a light with a wavelength of 200 nm or less, and may have an extinction coefficient of 0.3 to 0.7 for a light with a wavelength of 200 nm or less.

The light shielding film may include chrome, oxygen, nitrogen and carbon, and may include the chrome in an amount of 44 to 60 atom %.

The blank mask may include a multiple film, the multilayer film may include a phase shift film and the light shielding film, and the optical density for a light with a wavelength of 200 nm or less of the multiple film may be 3 or more.

A blank mask according to another embodiment may include a transparent substrate; a phase shift film disposed on the transparent substrate; and a light shielding film disposed on the phase shift film.

The blank mask may have a Photon energy of incident light of 4.0 to 5.0 eV in a point having a Del_2 of 0 which is expressed by Equation 3 below, when $PE_1$ value is 3.0 eV and $PE_2$ value is 5.0 eV.

$$\mathrm{Del\_2} = \lim_{\Delta PE \to 0} \left(\frac{\Delta DPS}{\Delta PE}\right) \quad \text{[Equation 3]}$$

In the Equation 3, the DPS value is a value of the phase difference between P wave and S wave of reflected light if the phase difference between P wave and S wave of the reflected light is 180° or less, or a value of subtracting the phase difference between P wave and S wave of the reflected light from 360° if the phase difference between P wave and S wave of the reflected light is more than 180°, when the light shielding film is removed from the blank mask and after that the surface of the phase shift film is measured with a spectroscopic ellipsometer by applying an incident angle to be 64.5°, wherein the PE value is a Photon energy of incident light within a range of the $PE_1$ value to the $PE_2$ value.

The blank mask may have a Photon energy of 1.7 eV to 2.3 eV in a point having the Del_2 value of 0, when the $PE_1$ value is 1.5 eV and the $PE_2$ value is 3.0 eV.

The blank mask may have an average Del_2 value of 85 to 98°/eV, when the $PE_1$ value is 1.5 eV and the $PE_2$ value is the minimum value within Photon energy values of incident light in a point having the Del_2 value of 0.

The blank mask may have an average Del_2 value of −65 to −55°/eV, when the $PE_1$ value is the minimum value within Photon energy values of incident light in a point having the Del_2 value of 0, and the $PE_2$ value is the maximum value within Photon energy values of incident light in a point having the Del_2 value of 0.

The blank mask may have an average Del_2 value of 60 to 120°/eV, when the $PE_1$ value is the maximum value within Photon energy values of incident light in a point having the Del_2 value of 0, and the $PE_2$ value is 5.0 eV.

The blank mask may have a maximum value of Del_2 of 105 to 300°/eV, when the $PE_1$ value is 1.5 eV and the $PE_2$ value is 5.0 eV.

The blank mask may have a Photon energy of 4.5 eV or more in a point having the maximum value of the Del_2 value.

The blank mask may have the TFT1 value of 0.25 μm/100° C. or less.

The blank mask may have the TFT1 value of 0.2 μm/100° C. or less, when the T1 is 50° C. and the T2 is 80° C.

The blank mask may have the TFT1 value of 0.2 μm/100° C. or less when the T1 is 50° C. and the T2 is 150° C.

The blank mask may have the TFT2 value of 0.25 μm/100° C. or less.

The phase shift film may include a phase difference adjustment layer and a protective layer disposed on the phase difference adjustment layer.

The phase shift film may include a transition metal, silicon, oxygen, and nitrogen.

The phase difference adjustment layer may include nitrogen in an amount of 40 to 60 atom %.

The protective layer may include nitrogen in an amount of 20 to 40 atom %.

The protective layer may include a region having a ratio of nitrogen content compared to oxygen content which is 0.4 to 2 in the thickness direction, and the region may have a thickness of 30 to 80% compared to the entire thickness of the protective layer.

The ratio of the thickness of the protective layer compared to the thickness of the phase shift film may be 0.04 to 0.09.

The thickness of the protective layer may be 25 Å to 80 Å.

The phase difference adjustment layer may have a refractive index of 2 to 4 for a light with a wavelength of 200 nm or less, and may have an extinction coefficient of 0.3 to 0.7 for a light with a wavelength of 200 nm or less.

The light shielding film may include chrome, oxygen, nitrogen and carbon, and may include the chrome in an amount of 44 to 60 atom %.

The blank mask may include a multilayer film, the multilayer film may include a phase shift film and the light shielding film, and the optical density for a light with a wavelength of 200 nm or less of the multilayer film may be 3 or more.

A photomask according to another embodiment includes a transparent substrate; a phase shift pattern film disposed on the transparent substrate; and a light shielding pattern film disposed on the phase shift pattern film.

The photomask may have a TFT3 value of 0.25 μm/100° C. or less expressed by Equation 4 below.

$$TFT3 = \frac{\Delta pPM}{T2 - T1} \qquad \text{[Equation 4]}$$

Here, when the thermal variation of a processed photomask, which is formed by processing the thickness of the transparent substrate of the photomask to be 0.6 mm and removing the light shielding pattern film, is analyzed in a thermomechanical analyzer, the measuring temperature of the thermomechanical analyzer is increased from the T1 to the T2, and the ΔpPM is a position change of the upper surface of the phase shift film in the thickness direction at the T2, based on a position of the upper surface of the phase shift film at the T1.

A photomask according to another embodiment includes a transparent substrate; a phase shift pattern film disposed on the transparent substrate; and a light shielding pattern film disposed on the phase shift pattern film.

The photomask has a Photon energy of incident light in a point having a Del_1 of 0 expressed by Equation 5 below, when $PE_1$ value is 3.0 eV and $PE_2$ value is 5.0 eV.

$$Del\_1 = \lim_{\Delta PE \to 0}\left(\frac{\Delta pDPS}{\Delta PE}\right) \qquad \text{[Equation 5]}$$

In the Equation 5, the pDPS value is a value of the phase difference between P wave and S wave of reflected light if the phase difference between P wave and S wave of the reflected light is 180° or less, or a value of subtracting the phase difference between P wave and S wave of the reflected light from 360° if the phase difference between P wave and S wave of the reflected light is more than 180°, when the light shielding pattern film is removed from the photomask and the surface of the phase shift pattern film is measured with a spectroscopic ellipsometer by applying an incident angle to be 64.5°.

The PE value is a Photon energy of incident light within a range of the $PE_1$ to the $PE_2$.

A manufacturing device for a semiconductor element according to another embodiment includes a light source and a photomask in which light from the light source is incident and the incident light is selectively transmitted to be projected to a surface of a semiconductor wafer.

The photomask includes a transparent substrate; a phase shift pattern film disposed on the transparent substrate; and a light shielding pattern film disposed on the phase shift film.

The photomask may have a TFT3 value of 0.25 μm/100° C. or less expressed by Equation 4 below.

$$TFT3 = \frac{\Delta pPM}{T2 - T1} \qquad \text{[Equation 4]}$$

Here, when the thermal variation of a processed photomask, which is formed by processing the thickness of the transparent substrate of the photomask to be 0.6 mm and removing the light shielding pattern film, is analyzed in a thermomechanical analyzer, the measuring temperature of the thermomechanical analyzer is increased from the T1 to the T2, and the ΔpPM is a position change of the upper surface of the phase shift film in the thickness direction at the T2, based on a position of the upper surface of the phase shift film at the T1.

A manufacturing device for a semiconductor element according to another embodiment includes a light source; and a photomask in which light from the light source is incident and the incident light is selectively transmitted to be projected to a surface of a semiconductor wafer.

The photomask has a Photon energy of incident light of 4.0 to 5.0 eV in a point having a Del_1 of 0 expressed by Equation 5 below, when $PE_1$ value is 3.0 eV and $PE_2$ value is 5.0 eV.

$$Del\_1 = \lim_{\Delta PE \to 0}\left(\frac{\Delta pDPS}{\Delta PE}\right) \qquad \text{[Equation 5]}$$

In the Equation 5, the pDPS value is a value of the phase difference between P wave and S wave of reflected light if the phase difference between P wave and S wave of the reflected light is 180° or less, or a value of subtracting the phase difference between P wave and S wave of the reflected light from 360° if the phase difference between P wave and S wave of the reflected light is more than 180°, when the light shielding pattern film is removed from the photomask and the surface of the phase shift pattern film is measured with a spectroscopic ellipsometer by applying an incident angle to be 64.5°.

The PE value is a Photon energy of incident light within a range of the $PE_1$ to the $PE_2$.

DETAILED DESCRIPTION

Figure 1:
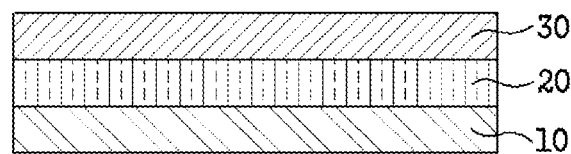
FIG. 1 is a conceptual view for showing a blank mask according to one embodiment of the present disclosure.

Hereinafter, example embodiments of the present disclosure will be described in detail with reference to the accompanying drawings so that they can be easily practiced by those skilled in the art to which the present invention pertains. However, the example embodiments may be embodied in many different forms and is not to be construed as being limited to the embodiments set forth herein.

In this application, the term for degree like "about", "substantially" and the like is used for meaning values approximative from/to the value when a tolerance proper to referred meaning for manufacture and substance is presented. Additionally, these terms for degree are used to help understanding of example embodiments and to prevent that an unconscionable trespasser unjustly uses the presented content in which exact or absolute number is referred.

Throughout this application, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this application, the description of "A and/or B" means "A, B, or A and B."

Throughout this application, terms such as "first", "second", "A", or "B" are used to distinguish the same terms from each other unless specially stated otherwise.

In this application, "B being placed on A" means that B is placed in direct contact with A or placed over A with another layer or structure interposed therebetween and thus should not be interpreted as being limited to B being placed in direct contact with A.

In this application, a singular form is contextually interpreted as including a plural form as well as a singular form unless specially stated otherwise.

In this application, the transmissive portion means an area on the surface of the photomask, on which a phase shift film is not formed and thereby transmits exposure light, and the semi-transmissive portion means an area, on which the phase shift film is formed and thereby transmits attenuated exposure light.

In this application, the incident angle means an angle between the direction of the incident light of a spectroscopic ellipsometer and the normal line of the phase shift film.

In this application, room temperature means 20° C. to 25° C.

A semiconductor device may be manufactured by transferring a pattern on a surface of a semiconductor wafer. In detail, a photomask comprising a designed pattern is disposed on a semiconductor wafer having a resist layer applied thereto, and then exposure is performed through a light source. In this case, the resist layer of the semiconductor wafer has the shape of a designed pattern through a developing solution treatment.

As semiconductors are highly integrated, more miniaturized circuit patterns are required. In order to form a miniaturized pattern on a semiconductor wafer, exposure light having a shorter wavelength than conventional exposure light may be applied. As for the exposure light applied to the miniaturized pattern formation, for example, an ArF excimer laser (wavelength of 193 nm) may be used.

A light source that generates exposure light having a short wavelength may require high optical power. Such a light source may increase the temperature of a photomask in an exposure process.

Thin films comprised in the photomask to form a pattern may have a characteristic that physical properties such as thickness and height change according to temperature change. Each thin film is not formed of the same material and may have a multi-layered structure of at least two or more layers. In addition, since the thin films are sometimes subjected to oxidation treatment, heat treatment, and the like, a difference may be shown between the characteristics of the thin film itself right after a sputtering and the characteristics of the thin film comprised in the completed blank mask. In particular, when variation ranges in thickness, height, and the like of each thin film depending on temperature are not controlled, the resolution of a pattern formed on a semiconductor wafer may be deteriorated.

Meanwhile, in order to develop a more minute circuit pattern with excellent resolution, it is necessary to control the phase difference and transmittance of the phase shift film more precisely, and to further reduce the thickness of the phase shift film.

A protective layer may be formed on the surface of the phase shift film to improve durability of the phase shift film. As a method of forming a protective layer on the surface of the phase shift film, a method of forming a protective layer without applying a separate process through a natural oxidation reaction, a method of forming a separate layer on the surface of the phase shift film through sputtering, etc., a method of applying a heat treatment process to the surface of the phase shift film.

When a natural oxidation process is applied, the optical characteristic distribution in the in-plane direction of the phase shift film may be uneven, and the durability of the phase shift film may be somewhat insufficient. When a process of forming a separate layer on the surface of the phase shift film or a heat treatment process is applied, the optical properties of the entire phase shift film may vary greatly due to the influence of the formed protective layer.

The inventors of embodiments completed the embodiments by experimentally confirming that it is possible to provide a blank mask having a more improved resolution by a method such as adjusting the thermal variation value depending on the temperature of the films comprised in the blank mask within a certain range.

Hereinafter, the embodiments will be described in more detail.

FIG. 1 is a conceptual view for showing a blank mask according to one embodiment of the present application. An embodiment will be described with reference to FIG. 1.

A blank mask 100 according to one embodiment of the present application comprises a transparent substrate 10; a phase shift film 20 disposed on the transparent substrate 10; and a light shielding film 30 disposed on the phase shift film 20.

The material of the transparent substrate 10 is not limited as long as it has light transmittance to exposure light and can be applied to a photomask. Specifically, the transmittance of the transparent substrate 10 with respect to exposure light having a wavelength of 200 nm or less may be 85% or more. The transmittance may be 87% or more. For example, the transparent substrate 10 may be a synthetic quartz substrate. In such a case, attenuation of light transmitting the transparent substrate 10 can be suppressed.

In addition, optical distortion can be suppressed by adjusting surface characteristics such as flatness and roughness of the transparent substrate 10.

The phase shift film 20 may be disposed on a surface of the transparent substrate 10.

Thermal Variation Characteristics of Phase Shift Film

The blank mask has a TFT1 value of 0.25 μm/100° C. or less expressed by Equation 1 below.

$$TFT1 = \frac{\Delta PM}{T2 - T1} \quad \text{[Equation 1]}$$

Here, when the thermal variation of a processed blank mask, which is formed by processing the thickness of the transparent substrate of the blank mask to be 0.6 mm and removing the light shielding film, is analyzed in the thermomechanical analyzer, the measuring temperature of the thermomechanical analyzer is increased from the T1 to the T2, and the ΔPM is a position change of the upper surface of the phase shift film in the thickness direction at T2 based on a position of the upper surface of the phase shift film at T1.

The optical properties of the phase shift film 20 are determined depending on various factors, such as the composition of elements comprised in the phase shift film 20, and the density and thickness of the phase shift film 20. Accordingly, in order to maximize the resolution of the blank mask 100, the phase shift film 20 is designed and formed in consideration of the above factors. The phase shift film 20 may be exposed to heat generated from a light source during an exposure process. Due to the heat, a thickness value, stress, etc. of the phase shift film 20 may be changed. In this case, the optical properties of the phase shift film may exhibit a changed value rather than a previously designed value. In addition, when such a phase shift film 20 is patterned, deformation of the patterned phase shift film is easily induced, which may be a factor of lowering the resolution of a photomask. The embodiments may effectively suppress a decrease in resolution of the blank mask through a method of controlling thermal variation of the phase shift film, and the like.

The TFT1 value according to the Equation 1 can be controlled and adjusted by various factors such as the type of element constituting the phase shift film 20, the content of each element, the magnetic field strength applied to a sputtering process, the rotation speed of the substrate, the electric power applied to a target, the composition of an atmosphere gas, the temperature for sputtering, the condition during a post-treatment process. Specifically, the embodiment may control the TFT1 value of the phase shift film 20 by applying a method such as adjusting the magnetic field strength applied when the phase shift film 20 is formed.

When the phase shift film 20 is formed, by disposing a magnet in sputtering equipment, a magnetic field in a sputtering chamber can be formed, and plasma can be distributed over the front surface of a sputtering target. In addition, by controlling the distribution and intensity of the magnetic field, the density of the phase shift film 20 formed by sputtering equipment may be adjusted.

In detail, the higher the magnetic field strength, the higher the density of plasma formed in the chamber, so that the formed phase shift film 20 may be dense. The weaker the magnetic field strength, the lower the density of plasma formed in the chamber, so that the formed phase shift film 20 may be sparse. That is, the density of the phase shift film 20 can be adjusted by adjusting the magnetic field condition of the sputtering equipment, and thereby it is possible to control TFT1 value.

The TFT1 value is measured through a thermomechanical analyzer. In detail, a tip of the thermomechanical analyzer is positioned on the surface of the phase shift film 20 to be measured. Thereafter, a load of a fixed size is applied to the surface of the phase shift film 20 through the tip, the surface of the phase shift film 20 is heated at a temperature increase rate preset in the embodiment, and thereby a position change of the upper surface of the phase shift film in the thickness direction, that is, the TFT1 value is measured.

Unlike simply measuring the thickness of a thin film depending on the temperature, when the TFT1 value is measured in the same way as above, the stress change of the thin film according to the temperature change, the degree of thermal expansion of the thin film, the degree of warpage of the substrate comprising the thin film, and the like can be comprehensively evaluated.

The TFT1 value is measured under the condition of a tip load of 0.05N, a temperature increase rate of 10° C./min, and a measuring temperature range of 30 to 200° C.

In the embodiment, when the TFT value is measured, the thickness of the transparent substrate 10 is processed to be 0.6 mm. This is to allow the blank mask to be measured to be easily put into the thermomechanical analyzer. As a method of controlling the thickness of the transparent substrate 10, for example, a method of etching the other surface of the transparent substrate 10 which is located opposite to one surface of the transparent substrate 10 on which the phase shift film 20 is disposed, a method of cutting a part of the transparent substrate 10 on which the phase shift film 20 is disposed, and the like may be used.

When the TFT1 value is measured, the measurement is performed after removing the light shielding film 30 disposed on the phase shift film 10. When another layer is positioned between the phase shift film 20 and the light shielding film 30, the other layer is also removed. That is, a measuring target blank mask 100 is processed and measured to allow the outermost surface of the phase shift film 20 to be exposed. As a method of removing the light shielding film 30 and the other films, etching may be used. However, the present application is not limited thereto.

On the upper surface of the phase shift film 20, a portion in which the phase shift film 20 and another thin film (e.g., a light shielding layer) positioned in contact with the phase shift film 20 are mixed may exist. In this case, the TFT1 value is measured after even the mixed portion is removed.

Since it is technically difficult to remove the mixed portion without damaging the phase shift film 20, the mixed portion and the upper portion of the phase shift film are removed for the processed phase shift film 20 to have a thickness of 50 nm or more, and thereby the TFT value is measured.

As a thermomechanical analyzer for measuring the TFT1 value, for example, there is a Q400 model available from TA INSTRUMENT.

When the TFT1 value is calculated, $\Delta$PM means the absolute value of a position change value of the upper surface of the phase shift film in the thickness direction at T2, based on a position of the upper surface of the phase shift film at T1. For example, when the dimensional change in the thickness direction of the phase shift film at T1 is 0.2 $\mu$m and the dimensional change in the thickness direction of the phase shift film at T2 is 0.5 $\mu$m, $\Delta$PM is 0.3 $\mu$m.

T1 is an initial temperature of the thermomechanical analyzer when the TFT1 value is measured.

T2 is a temperature increased from the initial temperature of the thermomechanical analyzer when the TFT1 value is measured.

The TFT1 value is calculated to have a unit of $\mu$m/100° C. For example, when T1 value is 30° C., T2 value is 200° C., and $\Delta$PM value is 0.25 $\mu$m, the calculated TFT value is $$\frac{0.25}{200-30} * 100 = 0.147 \ \mu m/100° C.$$

The TFT1 value of the blank mask 100 may be 0.25 $\mu$m/100° C. or less. The TFT1 value may be 0.2 $\mu$m/100° C. or less. The TFT1 value may be 0.18 $\mu$m/100° C. or less. The TFT1 value may be 0.1 $\mu$m/100° C. or more. The TFT1 value may be 0.12 $\mu$m/100° C. or more. The TFT1 value may be 0.15 $\mu$m/100° C. or more.

When T1 is 30° C. and T2 is 200° C., the TFT1 value of the blank mask 100 may be 0.25 $\mu$m/100° C. or less. The TFT1 value may be 0.2 $\mu$m/100° C. or less. The TFT1 value may be 0.18 $\mu$m/100° C. or less. The TFT1 value may be 0.1 $\mu$m/100° C. or more. The TFT1 value may be 0.12 $\mu$m/100° C. or more. The TFT1 value may be 0.15 $\mu$m/100° C. or more.

When T1 is 50° C. and T2 is 80° C., the TFT1 value of the blank mask 100 may be 0.25 $\mu$m/100° C. or less. The TFT1 value may be 0.2 $\mu$m/100° C. or less. The TFT1 value may be 0.18 $\mu$m/100° C. or less. The TFT1 value may be 0.1 $\mu$m/100° C. or more. The TFT1 value may be 0.12 $\mu$m/100° C. or more. The TFT1 value may be 0.15 $\mu$m/100° C. or more.

In such a case, it is possible to suppress deformation of the phase shift pattern film due to heat generated in the exposure process, and it is possible to improve the resolution of the photomask. In addition, the phase shift pattern layer may have stable durability.

When T1 is 50° C. and T2 is 150° C., the TFT1 value of the blank mask 100 may be 0.25 $\mu$m/100° C. or less. The TFT1 value may be 0.2 $\mu$m/100° C. or less. The TFT1 value may be 0.18 $\mu$m/100° C. or less. The TFT1 value may be 0.1 $\mu$m/100° C. or more. The TFT1 value may be 0.12 $\mu$m/100° C. or more. The TFT1 value may be 0.15 $\mu$m/100° C. or more.

In such a case, the photomask can have excellent resolution even at a relatively high temperature.

When T1 is 100 to 140° C. and T2 is expressed by T2=T1+5° C., the TFT1 value of the blank mask 100 may be 0.1 $\mu$m or less. The TFT1 value may be 0.07 $\mu$m or less. The TFT1 value may be 0.05 $\mu$m or less. The TFT1 value may be 0.005 $\mu$m or more. The TFT1 value may be 0.01 $\mu$m or more. The TFT1 value may be 0.02 $\mu$m or more. In such a case, in the patterned phase shift film, optical property variation and pattern distortion caused by an increase of atmospheric temperature in the exposure process can be suppressed.

When T1 is 170 to 180° C. and T2 is expressed by T2=T1+5° C., the TFT1 value of the blank mask 100 may be 0.15 $\mu$m or less. The TFT1 value may be 0.12 $\mu$m or less. The TFT1 value may be 0.1 $\mu$m or less. The TFT1 value may be 0.005 $\mu$m or more. The TFT1 value may be 0.01 $\mu$m or more. The TFT1 value may be 0.02 $\mu$m or more. In such a case, the phase shift film may have stable durability in a high-temperature atmosphere.

Thermal Variation Characteristics of Light Shielding Film

The blank mask 100 may have a TFT2 value of 0.25 $\mu$m/100° C. expressed by Equation 2 below.

$$TFT2 = \frac{\Delta PC}{T2-T1} \qquad \text{[Equation 2]}$$

Here, when the thermal variation of the processed blank mask 100, which is formed by processing the thickness of the transparent substrate 10 of the blank mask to be 0.6 mm, is analyzed in a thermomechanical analyzer, the measuring temperature of the thermomechanical analyzer is increased from the T1 to the T2, and the $\Delta$PC is a position change of the upper surface of the light shielding film 30 in the thickness direction at the T2 based on a position of the upper surface of the light shielding film 30 at the T1.

The patterned light shielding film 30 may be disposed on the pattern of the phase shift film 20 to form a blind pattern. Like the pattern of the phase shift film 20, the pattern of the light shielding film 30 may also be exposed to heat generated from a high-power light source in an exposure process. As a result, a thickness value of the light shielding film 30, residual stress, a degree of warpage of a substrate comprising the light shielding film, and the like may vary. Such a variation may be a factor of lowering the resolution of a pattern to be developed like the case of the phase shift film 20. By adjusting the TFT2 value of the blank mask within a range preset in the embodiment, the embodiment can suppress a dimensional change in the thickness direction of the light shielding film 30 caused from heat generated from the high-power light source.

The TFT2 value of the blank mask 100 may be affected by various factors such as elements constituting the light shielding film 30, the process condition of sputtering, and the thickness of the light shielding film 30. Specifically, the embodiment controlled the magnetic field strength during sputtering of the light shielding film 30 and thereby adjusted the TFT2 value of the blank mask 100. Specifically, the TFT2 value was adjusted by controlling the density of the light shielding film 30 formed through magnetic field control during sputtering of the light shielding film 30.

The TFT2 value is measured through a thermomechanical analyzer. In detail, a tip of the thermomechanical analyzer is positioned on the surface of the light shielding film 30 to be measured. Thereafter, a load of a fixed size is applied to the surface of the light shielding film 30 through the tip, and the surface of the light shielding film 30 is heated at a temperature increase rate preset in the embodiment to measure a position change in the thickness direction of the light shielding film depending on the temperature.

Unlike simply measuring the thickness of the light shielding film 30 depending on the temperature, when the TFT2 value is measured in the same way as above, the stress change of the light shielding film 30 according to the temperature change, the degree of thermal expansion of the light shielding film 30, the degree of warpage of the substrate comprising the light shielding film 30, and the like can be comprehensively evaluated.

When measuring the TFT2 value, the measurement conditions applied to the thermomechanical analyzer are the same as when measuring the TFT1 value.

When measuring the TFT2 value, the thickness of the transparent substrate 10 is processed to be 0.6 mm. The processing method of the transparent substrate 10 is applied to be the same as when measuring the TFT1 value.

When measuring the TFT2 value, if another layer is located on the light shielding film 30, the measurement is performed after removing the other layer. As a method for removing the other film, etching may be used. However, the present application is not limited thereto.

Depending on the manufacturing process, a portion in which the light shielding film 30 and other layers disposed on the light shielding film 30 are mixed may exist. In this case, the TFT2 value is measured after removing the mixed portion.

When the mixed portion is removed, it is technically difficult to remove the mixed portion without damaging the light shielding film, so that the mixed portion and the upper portion of the light shielding film are removed for the light shielding film to have a thickness of 40 nm or more after being processed.

As a thermomechanical analyzer for measuring the TFT2 value, a Q400 model available from TA INSTRUMENT may be exemplarily used for measurement.

When the TFT2 value is calculated, ΔPC means the absolute value of a position change of the upper surface of the light shielding film 30 in the thickness direction at T2 based on a position of the upper surface of the light shielding film 30 at T1. For example, when the dimensional change in the thickness direction of the light shielding film at T1 is 0.2 μm and the dimensional change in the thickness direction of the light shielding film at T2 is 0.5 μm, ΔPC corresponds to 0.3 μm.

T1 is an initial temperature of the thermomechanical analyzer when the TFT2 value is measured.

T2 is a temperature increased from the initial temperature of the thermomechanical analyzer when the TFT2 value is measured.

The TFT2 value is calculated to have a unit of the T2-T1 values which is μm/100° C. For example, when T1 value is 30° C., T2 value is 200° C., and ΔPM value is 0.25 μm, the calculated TFT value corresponds to $$\frac{0.25}{200-30} * 100 = 0.147 \ \mu m/100° \ C.$$

The TFT2 value of the blank mask 100 may be 0.25 μm/100° C. or less. The TFT2 value may be 0.2 μm/100° C. or less. The TFT2 value may be 0.1 μm/100° C. or less. The TFT2 value may be 0.07 μm/100° C. or less. The TFT2 value may be 0.01 μm/100° C. or more. The TFT2 value may be 0.03 μm/100° C. or more. The TFT2 value may be 0.05 μm/100° C. or more.

The blank mask 100 may have a TFT2 value of 0.25 μm/100° C. or less when T1 is 30° C. and T2 is 200° C. The TFT2 value may be 0.2 μm/100° C. or less. The TFT2 value may be 0.1 μm/100° C. or less. The TFT2 value may be 0.07 μm/100° C. or less. The TFT2 value may be 0.01 μm/100° C. or more. The TFT2 value may be 0.03 μm/100° C. or more. The TFT2 value may be 0.05 μm/100° C. or more.

The blank mask 100 may have a TFT2 value of 0.8 μm/100° C. or less when T1 is 50° C. and T2 is 150° C. The TFT2 value may be 0.7 μm/100° C. or less. The TFT2 value may be 0.6 μm/100° C. or less. The TFT2 value may be 0.2 μm/100° C. or more. The TFT2 value may be 0.3 μm/100° C. or more. The TFT2 value may be 0.5 μm/100° C. or more.

The blank mask 100 may have a TFT2 value of 0.8 μm/100° C. or less when T1 is 50° C. and T2 is 100° C. The TFT2 value may be 0.7 μm/100° C. or less. The TFT2 value may be 0.6 μm/100° C. or less. The TFT2 value may be 0.2 μm/100° C. or more. The TFT2 value may be 0.3 μm/100° C. or more. The TFT2 value may be 0.5 μm/100° C. or more.

In such a case, in the exposure process, it is possible to suppress the optical properties of the light shielding film 30 from being changed and the resolution of the photomask from being deteriorated due to heat emitted from a high-power light source.

In the blank mask 100, when T1 is 100° C. to 140° C. and T2 is expressed by T2=T1+5° C., the TFT2 value may be 0.1 μm/100° C. or less. The TFT2 value may be 0.07 μm/100° C. or less. The TFT2 value may be 0.05 μm/100° C. or less. The TFT2 value may be 0.005 μm/100° C. or more. The TFT2 value may be 0.01 μm/100° C. or more. The TFT2 value may be 0.02 μm/100° C. or more. In such a case, when the patterned light shielding film is applied to a lithography process, shape deformation due to an increase in temperature can be suppressed.

The blank mask 100 may have a TFT2 value of 0.15 μm/100° C. or less when T1 is 170° C. to 180° C. and T2 is expressed by T2=T1+5° C. The TFT2 value may be 0.12 μm/100° C. or less. The TFT2 value may be 0.1 μm/100° C. or less. The TFT2 value may be 0.005 μm/100° C. or more. The TFT2 value may be 0.01 μm/100° C. or more. The TFT2 value may be 0.02 μm/100° C. or more. In such a case, the patterned light shielding film can have stable optical properties and durability at a high temperature.

Layer Structure of Phase Shift Film

Figure 2:
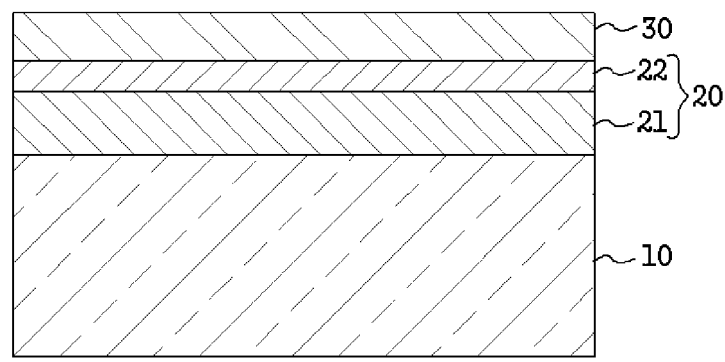
FIG. 2 is a conceptual view for showing a blank mask according to another embodiment of the present disclosure.

FIG. 2 is a conceptual view for showing a blank mask according to another embodiment of the present application. An embodiment will be described with reference to FIG. 2.

The phase shift film 20 may comprise a phase difference adjustment layer 21 and a protective layer 22 disposed on the phase difference adjustment layer 21.

The phase shift film 20, the phase difference adjustment layer 21, and the protective layer 22 may comprise a transition metal, silicon, oxygen, and nitrogen.

The phase difference adjustment layer 21 is a layer in which the transition metal, silicon, oxygen, and nitrogen are uniformly comprised within the range of 5 atom % in the thickness direction from the phase shift film 20. The phase difference adjustment layer 21 can substantially adjust the phase difference and transmittance of light transmitting the phase shift film 20.

In detail, the phase difference adjustment layer 21 has a characteristic of shifting the phase of the exposure light incident from the back side of the transparent substrate 10. Due to such a characteristic, the phase shift film 20 effectively cancels the diffracted light generated at the edge of a transmissive portion in a photomask, so that the resolution of the photomask is further improved when a lithography process is performed.

In addition, the phase difference adjustment layer 21 attenuates the exposure light incident from the back side of the transparent substrate 10. Through this, the phase shift film 20 can block the transmission of the exposure light while canceling the diffracted light generated at the edge of the transmissive portion.

The protective layer 22 is a layer formed on the surface of the phase shift film and having a distribution in which the oxygen content is continuously decreased, and the nitrogen content is continuously increased at the same time in the thickness direction from the surface. The protective layer 22 may improve the durability of the phase shift film 20 by suppressing damage to the phase shift film 20 or the patterned phase shift film in an etching process or cleaning process of the photomask. In addition, the protective layer 22 can suppress oxidation of the phase difference adjustment layer 21 due to the exposure light in an exposure process.

Optical Properties of Phase Shift Film Measured with Ellipsometer

The blank mask may have a Photon energy of 1.8 eV to 2.14 eV in a point having Del_2 value of 0 according to Equation 4 below, when $PE_1$ value is 1.5 eV and $PE_2$ value is 3.0 eV.

$$\text{Del\_2} = \lim_{\Delta PE \to 0} \left( \frac{\Delta DPS}{\Delta PE} \right) \quad \text{[Equation 4]}$$

In the Equation 4, the DPS value is a phase difference between P wave and S wave of reflected light if the phase difference between P wave and S wave of the reflected light is 180° or less, or a value of subtracting the phase difference between P wave and S wave of the reflected light from 360° if the phase difference between P wave and S wave of the reflected light is more than 180°, when the light shielding film is removed from the blank mask and the surface of the phase shift film is measured with a spectroscopic ellipsometer by applying an incident angle to be 64.5°.

The PE value is a Photon energy of incident light within a range of the $PE_1$ value to the $PE_2$ value.

The resolution of the photomask can be improved by precisely adjusting the optical properties of the phase shift film 20.

In detail, the phase difference and transmittance with respect to the exposure light of the phase shift film 20 may be simultaneously adjusted. The phase difference and transmittance of the phase shift film 20 may be controlled by adjusting ingredients, the thickness, and the like of the phase shift film. The thickness and transmittance of the phase shift film 20 and the thickness and phase difference of the phase shift film 20 have characteristics that are related to each other. However, the phase difference and the transmittance have a trade-off relationship in which it is difficult to simultaneously have the desired values.

The embodiment can provide a further thinned phase shift film 20 whose phase difference and transmittance for light with a wavelength of 200 nm or less are regulated within the ranges preset in the embodiment, by controlling the phase difference distribution of P wave and S wave of the phase shift film measured with an ellipsometer.

Figure 3:
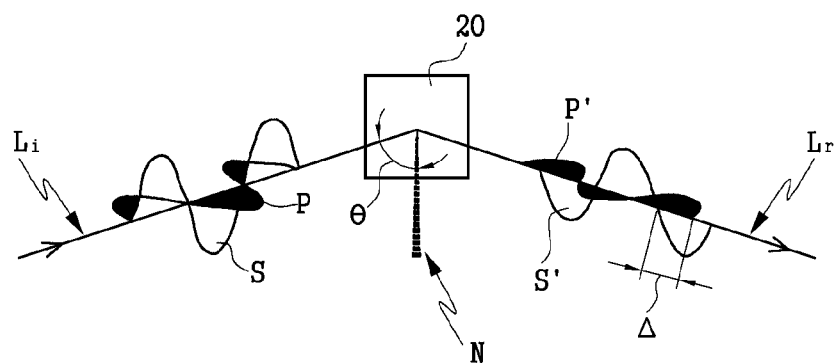
FIG. 3 is a conceptual view for showing a principle of measuring a phase difference between P wave and S wave of reflected light of a phase shift film by using a spectroscopic ellipsometer.

FIG. 3 is a conceptual view for showing a principle of measuring a phase difference between P wave and S wave of reflected light of a phase shift film by using a spectroscopic ellipsometer. An embodiment will be described with reference to FIG. 3.

The phase difference (Δ) value between P wave (P') and S wave (S') of reflected light ($L_r$) may vary depending on Photon energy of incident light ($L_i$) of a spectroscopic ellipsometer at a fixed incident angle (θ). The Del_2 value can be calculated by measuring the phase difference (Δ) between P wave (P') and S wave (S') of reflected light ($L_r$) with respect to Photon energy of incident light ($L_i$) of the phase shift film 20.

The distribution of Del_2 value can be adjusted by controlling various factors such as elements constituting the phase shift film 20, the condition of a sputtering process, the thickness of the phase shift film 20, and an incident angle set in a spectroscopic ellipsometer. Specifically, the distribution of Del_2 value of the phase shift film 20 may be controlled by a method such as adjusting the strength of a magnetic field applied to the formation of the phase shift film 20.

The Del_2 value is measured through a spectroscopic ellipsometer. For example, the phase difference (Δ) between P wave (P') and S wave (S') of reflected light ($L_r$) of the phase shift film may be measured through an MG-PRO model available from NANO-VIEW.

When the distribution of Del_2 value of the phase shift film 20 is measured, the measurement is performed after the light shielding film 30 positioned on the phase shift film 10 is removed. When another thin film is positioned between the phase shift film 20 and the light shielding film 30, the other film is also removed. As a method of removing the light shielding film 30 and the other films, there is an etching method or the like. However, the present application is not limited thereto. Since it is technically difficult to remove the other film positioned on the phase shift film 20 without damage to the phase shift film, damage of 1 nm or less in the thickness direction to the phase shift film during the etching process is allowed.

The blank mask may have a Photon energy of 1.8 eV to 2.14 eV in a point having the Del_2 value of 0, when $PE_1$ value is 1.5 eV and $PE_2$ value is 3.0 eV. The Photon energy may be 1.85 eV to 2.1 eV. The Photon energy may be 1.9 eV to 2.05 eV. In such a case, the phase shift film 20 may have a desired transmittance and a phase difference with respect to exposure light having a short wavelength and may have a smaller thickness.

The blank mask may have a Photon energy of 3.8 eV to 4.64 eV in a point having the Del_2 value of 0, when $PE_1$ value is 3 eV and $PE_2$ value is 5 eV.

When incident light ($L_i$) having a high photon energy is irradiated to a measuring target, the incident light ($L_i$) is reflected at a place with a shallow depth from the surface or in the surface of the phase shift film 20 due to the short wavelength of the incident light ($L_i$). When analyzing the phase difference of P wave and S wave of a reflected light formed by irradiating incident light ($L_i$) whose photon energy is set to be high to the surface of the phase shift film 20, the optical properties of the surface portion of the phase shift film 20, especially the optical properties of the protective layer 22 can be ascertained.

The protective layer 22 is disposed on the phase difference adjustment layer 21 to function as protecting the phase difference adjustment layer 21 from exposure light and a cleaning solution. As the thickness of the protective layer 22 increases and the protective layer 22 has a denser structure, the protective layer 22 can more stably protect the phase difference adjustment layer 21. However, when the protective layer 22 is formed in consideration of only the stable protection of the phase difference adjustment layer 21, the optical property variation of the entire phase shift film 20 may occur in a considerably great degree by the influence of the formation of the protective layer 22. In such a case, the phase shift film 20 may have a characteristic that deviates from the predesigned optical properties. The embodiment can provide a phase shift film 20 in which the phase difference adjustment layer 21 is stably protected while the optical properties are not significantly changed compared to before the formation of protective layer 22 by controlling the distribution characteristics of P wave and S wave of the reflected light of the phase shift film 20.

The distribution of Photon energy in a point having the Del_2 value of 0 when $PE_1$ value is 3 eV and $PE_2$ value is 5 eV can be adjusted by controlling factors such as the composition of atmospheric gas, the temperature of annealing, and the temperature increase rate during an annealing process of the phase difference adjustment layer 21. Specifically, the Del_2 value can be controlled by controlling the temperature of heat treatment and time when the annealing process is performed after UV light treatment on the surface of the formed phase difference adjustment layer 21.

The blank mask 100 may have a Photon energy of 3.8 eV to 4.64 eV in a point having the Del_2 value of 0, when $PE_1$ value is 3 eV and $PE_2$ value is 5 eV. The photon energy may be 4 eV to 4.62 eV. The photon energy may be 4.2 eV to 4.6 eV. The photon energy may be 4.3 eV to 4.5 eV. In such a case, while the protective layer 22 sufficiently protects the phase difference adjustment layer 21, the optical property variation of the phase shift film 20 due to the formation of the protective layer 22 can be controlled within a predetermined range.

The blank mask 100 may have an average Del_2 value which is 78°/eV to 98°/eV, when $PE_1$ value is 1.5 eV and $PE_2$ value is the minimum value within Photon energy values of incident light in a point having the Del_2 value of 0.

When the Photon energy of the incident light has a value which is greater than or equal to 1.5 eV and less than or equal to the range of the minimum value of Photon energy of incident light in a point having the Del_2 value of 0, the incident light has a relatively long wavelength value. Since such incident light is reflected after relatively deep penetration into the phase shift film, the average value of Del_2 measured by setting the Photon energy in the same range as above shows optical properties of the phase difference adjustment layer 21 which is disposed in the lower part of the phase shift film 20, and the like.

The blank mask 100 may have an average Del_2 value which is 78°/eV to 98°/eV, when $PE_1$ value is 1.5 eV and $PE_2$ value is the minimum value within Photon energy values of incident light in a point having the Del_2 value of 0. The average value may be 80 to 95°/eV. The average value may be 82 to 93°/eV. In such a case, the phase difference adjustment layer 21 can help the phase shift film 20 to have a desired phase difference and transmittance for light of a short wavelength while having a relatively low thickness.

The blank mask 100 may have an average Del_2 value which is −65°/eV to −55°/eV, when $PE_1$ value is the minimum value within Photon energy values of incident light in a point having the Del_2 value of 0 and $PE_2$ value is the maximum value within Photon energy values of incident light in a point having the Del_2 value of 0.

When the Photon energy of the incident light has a value which is greater than or equal to the minimum value within Photon energy values of incident light in a point having the Del_2 value of 0, and the $PE_2$ value has a value within a range of less than or equal to the maximum value of Photon energy values of incident light in a point having the Del_2 value of 0, an average value of the Del_2 values measured by applying the above conditions is influenced by the optical properties and the like of a portion located near the interface between the phase difference adjustment layer 21 and the protective layer 22.

The blank mask 100 may have an average Del_2 value which is −65°/eV to −55°/eV, when $PE_1$ value is the minimum value within Photon energy values of incident light in a point having the Del_2 value of 0 and $PE_2$ value is the maximum value within Photon energy values of incident light in a point having the Del_2 value of 0. The average value may be −62 to −56°/eV. The average value may be −59 to −57°/eV. In such a case, it is possible to suppress the interface formed between the phase difference adjustment layer 21 and the protective film 22 from greatly affecting the optical properties of the entire phase shift film.

The blank mask 100 may have an average Del_2 value which is 60°/eV to 120°/eV, when $PE_1$ value is the maximum value within Photon energy values of incident light in a point having the Del_2 value of 0 and $PE_2$ value is 5.0 eV.

An average value of Del_2 measured by setting $PE_1$ value to be the maximum value within Photon energy values of incident light in a point having the Del_2 value of 0 and $PE_2$ value to be 5.0 eV is influenced by the optical properties and the like of the protective layer 22.

The blank mask 100 may have an average Del_2 value which is 60°/eV to 120°/eV, when $PE_1$ value is the maximum value within Photon energy values of incident light in a point having the Del_2 value of 0 and $PE_2$ value is 5.0 eV. The average value may be 70 to 110°/eV. The average value may be 80 to 105°/eV. In such a case, the phase shift film 20 can have stable durability while reducing the influence of forming the protective layer 22 on the optical properties of the entire phase shift film 20.

When $PE_1$ value is 1.5 eV and $PE_2$ value is 3.0 eV, the blank mask 100 may have the absolute value of a difference value which is 0.001 to 0.2 eV between a Photon energy value of incident light in a point having Del_2 value of 0 measured after the protective layer 22 is formed and a Photon energy value of incident light in a point having the Del_2 value of 0 measured before the formation of the protective layer 22.

In a process of forming the protective layer 22 on the phase difference adjustment layer 21, a change in the optical properties of the phase difference adjustment layer 21 itself may occur. In detail, when annealing is applied to the phase difference adjustment layer 21 under controlled atmospheric pressure and temperature condition, changes in residual stress inside the phase difference adjustment layer 21 and the composition of the surface of the phase difference adjustment layer may occur. Such changes may cause variations in the optical properties of the phase difference adjustment layer 21 itself. This may cause the phase shift film to have characteristics deviating from the optical properties predetermined in the embodiment. The embodiment can provide a blank mask capable of exhibiting higher resolution by controlling the difference of the optical properties of the phase difference adjustment layer itself before and after the formation of the protective layer.

When $PE_1$ value is 1.5 eV and $PE_2$ value is 3.0 eV, the blank mask 100 may have the absolute value of a difference value which is 0.001 to 0.2 eV between a Photon energy value of incident light in a point having Del_2 value of 0 measured after the protective layer 22 is formed and a Photon energy value of incident light in a point having the Del_2 value of 0 measured before the formation of the protective layer 22. The absolute value may be 0.005 to 0.1 eV. The absolute value may be 0.01 to 0.008 eV. In such a case, the blank mask 100 may suppress optical variations of the phase difference adjustment layer 21 itself caused from the formation of the protective layer 22.

When $PE_1$ value is 3.0 eV and $PE_2$ value is 5.0 eV, the blank mask 100 may have the absolute value of a difference value which is 0.05 to 0.3 eV between a Photon energy value of incident light in a point having Del_2 value of 0 measured after the protective layer 22 is formed and a Photon energy value of incident light in a point having the Del_2 value of 0 measured before the formation of the protective layer 22. The absolute value may be 0.06 to 0.25 eV. The absolute value may be 0.1 to 0.23 eV. In such a case, the blank mask 100 may reduce the influence of the optical properties of the protective layer 22 itself on the optical properties of the entire phase shift film 20.

The blank mask may have a maximum value of Del_2 which is 105°/eV to 300°/eV, when $PE_1$ value is 1.5 eV and $PE_2$ value is 5.0 eV.

In the embodiment, by adjusting the maximum value of Del_2 when the $PE_1$ value is 1.5 eV and the $PE_2$ value is 5.0 eV in the blank mask 100, the phase shift film 20 can have stable durability while the optical characteristic variation of the entire phase shift film 20 caused from the formation the protective layer 22 can be controlled within a predetermined range.

The blank mask may have a maximum value of Del_2 which is 105°/eV to 300°/eV, when $PE_1$ value is 1.5 eV and $PE_2$ value is 5.0 eV. The maximum value may be 120 to 200 eV. The maximum value may be 140 to 160 eV. In such a case, the phase shift film 20 can have excellent light resistance and chemical resistance, etc., while reducing the variation of the optical properties of the entire phase shift film 20 caused from the formation of the protective layer 22.

The blank mask may have a Photon energy of 4.5 eV or more in a point having the maximum value of the Del_2, when $PE_1$ value is 1.5 eV and $PE_2$ value is 5.0 eV.

When the $PE_1$ value is 1.5 eV and the $PE_2$ value is 5.0 eV, the maximum value of Del_2 is influenced by the optical properties of the protective layer 22 and the like. The embodiment regulates a Photon energy value in a point having the maximum value of Del_2, and thereby the influence of the formation of the protective layer 22 on the optical properties of the entire phase shift film 20 can be reduced while the protective layer 22 has stable durability.

The blank mask may have a Photon energy of 4.5 eV or more in a point having the maximum value of the Del_2, when $PE_1$ value is 1.5 eV and $PE_2$ value is 5.0 eV. The Photon energy value in a point having the maximum value of Del_2 may be 4.55 eV or more. The Photon energy value in a point having the maximum value of Del_2 may be 5 eV or less. The Photon energy value in a point having the maximum value of Del_2 may be 4.8 eV or less. In such a case, the phase shift film 20 can exhibit desired optical properties with respect to a short wavelength, and at the same time suppress optical properties variations caused from exposure and cleaning processes.

The blank mask 100 may have a value of 60 to 260 eV which is obtained by subtracting the minimum value of the Del_2 from the maximum value of the Del_2, when $PE_1$ value is 1.5 eV and $PE_2$ value is 5.0 eV.

The inventors of the present disclosure experimentally ascertained that when the $PE_1$ value is 1.5 eV and the $PE_2$ value is 5.0 eV, the maximum value of Del_2 is influenced by the optical properties of the protective layer 22 of the phase shift film 20, and the minimum value of Del_2 is influenced by the optical properties of the upper portion of the phase difference adjustment layer 21.

When the $PE_1$ value is 1.5 eV and the $PE_2$ value is 5.0 eV, before and after the formation of the protective layer, the maximum value of Del_2 and the minimum value of Del_2 may have fluctuation. When the value obtained by subtracting the minimum value of Del_2 from the maximum value of Del_2 is controlled within a predetermined range, optical property variation of the entire phase shift film 20 before and after formation of the protective layer 22 may occur within an allowable range.

The blank mask may have a value of 60 to 260 eV which is obtained by subtracting the minimum value of the Del_2 from the maximum value of the Del_2, when the $PE_1$ value is 1.5 eV and the $PE_2$ value is 5.0 eV. The value obtained by subtracting the minimum value of Del_2 from the maximum value of Del_2 may be 80 to 240 eV. The value obtained by subtracting the minimum value of Del_2 from the maximum value of Del_2 may be 90 to 230 eV. In such a case, optical property variation of the entire phase shift film before and after the formation of the protective layer can be controlled within a predetermined range.

Composition of Phase Shift Film

The phase shift film 20 may comprise a transition metal, silicon, oxygen, and nitrogen. The transition metal may be one or more elements selected from molybdenum (Mo), tantalum (Ta), zirconium (Zr), and the like, but is not limited thereto. For example, the transition metal may be molybdenum.

The phase shift film 20 may comprise a transition metal of 1 to 10 atom %. The phase shift film 20 may comprise a transition metal of 2 to 7 atom %. The phase shift film 20 may comprise silicon in an amount of 15 to 60 atom %. The phase shift film 20 may comprise silicon in an amount of 25 to 50 atom %. The phase shift film 20 may comprise nitrogen in an amount of 30 to 60 atom %. The phase shift film 20 may comprise nitrogen in an amount of 35 to 55 atom %. The phase shift film 20 may comprise oxygen in an amount of 5 to 35 atom %. The phase shift film 20 may comprise oxygen in an amount of 10 to 25 atom %. In such a case, the phase shift film 20 can have optical properties suitable for a lithography process using exposure light having a short wavelength, specifically, light having a wavelength of 200 nm or less.

The phase shift film 20 may additionally comprise other elements in addition to the above-mentioned elements. For example, the phase shift film 20 may comprise argon (Ar), helium (He), or the like.

The phase shift film 20 may have different content for each element in the thickness direction.

The content distribution for each element formed in the depth direction of the phase difference adjustment layer 21 and the protective layer 22 may be ascertained by measuring a depth profile of the phase shift film 20. The depth profile of the phase shift film 20 may be measured using, for example, a K-alpha model available from THERMO SCIENTIFIC.

The phase difference adjustment layer 21 and the protective layer 22 may have different contents of each element, such as a transition metal, silicon, oxygen, and nitrogen.

The phase difference adjustment layer 21 may comprise a transition metal of 3 to 10 atom %. The phase difference adjustment layer 21 may comprise a transition metal of 4 to 8 atom %. The phase difference adjustment layer 21 may comprise silicon in an amount of 20 to 50 atom %. The phase difference adjustment layer 21 may comprise silicon in an amount of 30 to 40 atom %. The phase difference adjustment layer 21 may comprise oxygen in an amount of 2 to 10 atom %. The phase difference adjustment layer 21 may comprise oxygen in an amount of 3 to 8 atom %. The phase difference adjustment layer 21 may comprise nitrogen in an amount of 40 to 60 atom %. The phase difference adjustment layer 21 may comprise nitrogen in an amount of 45 to 55 atom %. In such a case, when light having a short wavelength, specifically light having a wavelength of 200 nm or less, is applied as the exposure light, the blank mask can have excellent pattern resolution.

As the protective layer 22 comprises more oxygen, it is possible to stably protect the phase difference adjustment layer 21 from exposure light and a cleaning solution, etc. However, formation of such a protective layer 22 may have a greater effect on the optical property variation of the entire phase shift film 20 that occurs before and after the formation of the protective layer 22. Accordingly, by controlling the content distribution of oxygen and nitrogen in the protective layer 22, the phase shift film 20 may have sufficient light resistance and chemical resistance while having optical properties desired in the embodiment.

The protective layer 22 may comprise nitrogen in an amount of 20 to 40 atom %. The protective layer 22 may comprise nitrogen in an amount of 25 to 35 atom %. The protective layer 22 may comprise oxygen in an amount of 10 to 50 atom %. The protective layer 22 may comprise oxygen in an amount of 20 to 40 atom %. The protective layer 22 may comprise silicon in an amount of 10 to 50 atom %. The protective layer 22 may comprise silicon in an amount of 20 to 40 atom %. The protective layer 22 may comprise a transition metal of 0.5 to 5 atom %. The protective layer 22 may comprise a transition metal of 1 to 3 atom %. In such a case, the protective layer 22 can sufficiently suppress the deterioration of the phase difference adjustment layer 21.

The protective layer 22 may comprise a region in which the nitrogen content (atom %) to the oxygen content (atom %) in the thickness direction is 1 or more. The region may have a thickness of 40 to 60% compared to a total thickness of the protective layer 22. The region may have a thickness of 45 to 55% compared to a total thickness of the protective layer 22. In such a case, it is possible to effectively suppress optical property variation of the phase shift film 20 caused from the formation of the protective layer 22.

The protective layer 22 may comprise a region in which the ratio of the nitrogen content (atom %) to the oxygen content (atom %) in the thickness direction is 0.4 to 2, and the region may have a thickness of 30 to 80% compared to a total thickness of the protective layer 22. The region may have a thickness of 40 to 60% compared to a total thickness of the protective layer 22. In such a case, it is possible to provide a blank mask capable of manufacturing a photomask having excellent resolution while having sufficient long-term durability.

The thickness measurement of the region in which the ratio of the nitrogen content (atom %) to the oxygen content (atom %) in the thickness direction is adjusted may be confirmed by measuring the depth profile of the protective layer 22. However, it is assumed that the etching rate for each depth of the protective layer 22 is constant in the depth profile when the thickness of the region is measured.

Optical Properties and Each Layer Thickness of Phase Shift Film

The phase shift film 20 may have a phase difference of 160 to 200° with respect to light having a wavelength of 200 nm or less. The phase shift film 20 may have a phase difference of 160 to 200° with respect to ArF light. The phase shift film 20 may have a phase difference of 170 to 190° with respect to light having a wavelength of 200 nm or less. The phase shift film 20 may have a phase difference of 170 to 190° with respect to ArF light. The phase shift film 20 may have a transmittance of 3 to 10% for light having a wavelength of 200 nm or less. The phase shift film 20 may have a transmittance of 3 to 10% for ArF light. The phase shift film 20 may have a transmittance of 4 to 8% for light having a wavelength of 200 nm or less. The phase shift film 20 may have a transmittance of 4 to 8% for ArF light. In such a case, a photomask comprising the phase shift film 20 may form a more precise minute pattern on a wafer in an exposure process to which exposure light of a short wavelength is applied.

The protective layer 22 may have a refractive index of 1.3 to 2 for light having a wavelength of 200 nm or less. The protective layer 22 may have a refractive index of 1.3 to 2 for ArF light. The protective layer 22 may have a refractive index of 1.4 to 1.8 for light having a wavelength of 200 nm or less. The protective layer 22 may have a refractive index of 1.4 to 1.8 for ArF light. An extinction coefficient for light having a wavelength of 200 nm or less of the protective layer 22 may be 0.2 to 0.4. An extinction coefficient for ArF light of the protective layer 22 may be 0.2 to 0.4. An extinction coefficient for light having a wavelength of 200 nm or less of the protective layer 22 may be 0.25 to 0.35. An extinction coefficient of the protective layer 22 for ArF light may be 0.25 to 0.35. In such a case, the optical property variation of the phase shift film 20 caused from the formation of the protective layer 22 may be minimized.

The phase difference adjustment layer 21 may have a refractive index of 2 to 4 for light having a wavelength of 200 nm or less. The phase difference adjustment layer 21 may have a refractive index of 2 to 4 for ArF light. The refractive index of the phase difference adjustment layer 21 for light having a wavelength of 200 nm or less may be 2.5 to 3.5. The refractive index of the phase difference adjustment layer 21 for ArF light may be 2.5 to 3.5. An extinction coefficient for light having a wavelength of 200 nm or less of the phase difference adjustment layer 21 may be 0.3 to 0.7. The extinction coefficient for ArF light of the phase difference adjustment layer 21 may be 0.3 to 0.7. The extinction coefficient for light having a wavelength of 200 nm or less of the phase difference adjustment layer 21 may be 0.4 to 0.6. The extinction coefficient for ArF light of the phase difference adjustment layer 21 may be 0.4 to 0.6. In such a case, the resolution of a photomask comprising the phase shift film 20 can be further improved.

The optical properties of the phase shift film 20, the protective layer 22, and the phase difference adjustment layer 21 may be measured using a spectroscopic ellipsometer. For example, the optical properties may be measured through MG-PRO equipment available from NANO-VIEW.

A ratio of the thickness of the protective layer 22 to a total thickness of the phase shift film 20 may be 0.04 to 0.09. The thickness ratio may be 0.05 to 0.08. In such a case, the protective layer 22 can stably protect the phase difference adjustment layer 21.

The thickness of the protective layer 22 may be 25 Å to 80 Å. The thickness of the protective layer 22 may be 35 Å to 45 Å. In such a case, it is possible to provide a phase shift film 20 that effectively reduces the degree of change in optical properties on the entire phase shift film due to the formation of the protective layer 22 and exhibits stable optical properties even in a long-term exposure process and a cleaning process.

The thickness of the phase shift film 20 and the thickness of each layer constituting the phase shift film 20 may be measured through a TEM (Transmission Electron Microscopy) image of a section of the phase shift film 20.

Each Layer Structure, Composition and Optical Properties of Light Shielding Film The light shielding film 30 may be disposed on the phase shift film 20. The light shielding film 30 may be used as an etching mask of the phase shift film 20 when the phase shift film 20 is etched according to a previously designed pattern shape. In addition, the light shielding film 30 may block transmission of the exposure light incident from the rear side of the transparent substrate 10.

The light shielding film 30 may have a single-layer structure. The light shielding film 30 may have a multi-layer structure of two or more layers. In a sputtering process of the light shielding film 30, a light shielding film 30 with plural layers may be formed by applying different atmospheric gas compositions and flow rates for each layer of the light shielding film. In the sputtering process of the light shielding film 30, a light shielding film 30 with plural layers may be formed by applying different sputtering targets for each layer of the light shielding film.

The light shielding film 30 may comprise chromium, oxygen, nitrogen, and carbon. The content of each element in the light shielding film 30 may be different in the thickness direction of the light shielding film 30. In the case of a light shielding film with plural layers, the respective layers in the light shielding film 30 may have different compositions each other.

The light shielding film 30 may comprise chromium in an amount of 30 to 70 atom %. The light shielding film 30 may comprise chromium in an amount of 47 to 57 atom %. The light shielding film 30 may comprise carbon in an amount of 5 to 30 atom %. The light shielding film 30 may comprise carbon in an amount of 7 to 25 atom %. The light shielding film 30 may comprise nitrogen in an amount of 3 to 30 atom %. The light shielding film 30 may comprise nitrogen in an amount of 5 to 25 atom %. The light shielding film 30 may comprise oxygen in an amount of 20 to 55 atom %. The light shielding film 30 may comprise oxygen in an amount of 25 to 40 atom %. In such a case, the light shielding film 30 may have sufficient extinction characteristics.

The multilayer film (not shown) comprises a phase shift film 20 and a light shielding film 30. The multilayer film may be formed in a blind pattern on the transparent substrate 10 to suppress transmission of exposure light.

The optical density of the multilayer film for light having a wavelength of 200 nm or less may be 3 or more. The optical density of the multilayer film for ArF light may be 3 or more. The optical density of the multilayer film for light having a wavelength of 200 nm or less may be 3.5 or more. The optical density of the multilayer film for ArF light may be 3.5 or more. In such a case, the multilayer film can have excellent light blocking properties.

Manufacturing Method for Phase Shift Film

The phase difference adjustment layer 21 in embodiments may be manufactured through sputtering on the transparent substrate 10.

The sputtering process may use DC power or RF power.

A target and a sputtering gas may be selected in consideration of the composition of the material constituting the phase difference adjustment layer 21.

In the case of a sputtering target, one target comprising a transition metal and silicon may be applied, and a target comprising a transition metal and a target comprising silicon may be applied simultaneously. When a target is applied as a sputtering target, the transition metal content compared to the sum of the transition metal and silicon contents of the target may be 30% or less. The content may be 20% or less. The content may be 10% or less. The content may be 2% or more. By applying such a target, it is possible to help a phase shift film formed by sputtering to have desired optical properties.

In a case of the sputtering gas, $CH_4$ as a gas comprising carbon, $O_2$ as a gas comprising oxygen, $N_2$ as a gas comprising nitrogen, and the like may be introduced. However, the present application is not limited thereto. An inert gas may be added to the sputtering gas. As the inert gas, there are Ar, He, and the like. However, the present application is not limited thereto. The film property of the phase difference adjustment layer 21 to be formed may be adjusted depending on the type and content of the inert gas. By controlling the composition of the inert gas, the optical properties of the phase shift film can be adjusted. Each gas comprised in the sputtering gas may be individually introduced into a chamber through different inlets. The sputtering gas may be introduced into the chamber by mixing each gas.

A magnet may be disposed in the chamber in order to improve the uniformity of the thickness and optical properties of the phase shift film to be formed in the in-plane direction. In detail, by positioning the magnet on the back side of a sputtering target and rotating the magnet at a speed preset in the embodiment, the plasma can be more evenly distributed over a front surface of the target. The magnet may be rotated at a speed of 50 to 200 rpm.

The rotation speed of the magnet may be fixed at a constant speed during sputtering. The rotation speed of the magnet may be varied during sputtering. The rotational speed of the magnet may be increased from the initial rotational speed with uniform acceleration during sputtering.

The rotation speed of the magnet may be increased by 5 to 20 rpm from the initial rotation speed during sputtering. The rotation speed of the magnet may be increased by 7 to 15 rpm from the initial rotation speed during sputtering. In such a case, the density distribution of the phase shift film in the in-plane direction thereof can be more easily controlled.

By controlling the magnetic field of the magnet, the density of plasma formed in the sputtering chamber can be adjusted. Through this, the density of the phase shift film to be formed can be controlled, and the TFT1 value of a blank mask and the optical properties of the phase shift film to be formed can be controlled. The magnetic field of the magnet applied when the phase shift film is formed may be 25 to 60 mT. The magnetic field may be 30 to 50 mT. In such a case, in the phase shift film 20 to be formed, thermal variation in the thickness direction in a lithography process to which exposure light of a short wavelength is applied can be suppressed, and a further thinned phase shift film can be formed.

In the sputtering process, T/S distance, which is the distance between the target and the substrate, and the angle between the substrate and the target may be adjusted. The T/S distance may be 240 to 260 mm. The angle between the substrate and the target may be 20 to 30 degrees. In such a case, the formation rate of the phase shift film is stably controlled, and it is possible to suppress an excessive increase in the internal stress of the phase shift film.

In the sputtering process, the rotation speed of the substrate having a target surface for film-forming may be adjusted. The rotation speed of the substrate may be 2 to 20 RPM. The rotation speed may be 5 to 15 RPM. When the rotation speed of the substrate having the target surface for film-forming is adjusted within such a range, the phase shift film can have stable durability while further improving the uniformity of optical properties in the in-plane direction.

A discharge region comprising a plasma atmosphere in the chamber may be formed by supplying electric power to a sputtering target located in the sputtering chamber. By controlling the magnetic field strength and the magnet rotation speed and simultaneously controlling the intensity of the electric power, the film property of a film formed during sputtering can be adjusted. The intensity of the electric power applied to the sputtering target may be 1 to 3 kW. The intensity of the electric power may be 1.5 to 2.5 kW. The intensity of the electric power may be 1.8 to 2.2 kW. In such a case, the thermal variation in the thickness direction according to the temperature change of the phase shift film may be controlled within a predetermined range.

A spectroscopic ellipsometer may be installed in the sputtering equipment. Through this, it is possible to control the film formation time while monitoring the optical properties of the phase difference adjustment layer to be formed. In detail, after setting the angle formed by the direction of the incident light with the surface of the phase difference adjustment layer to be formed, it is possible to monitor the Del_2 value and the like of the phase difference adjustment layer formed in real time during a deposition process. By performing a sputtering process until the Del_2 value falls within a range preset in the embodiment, it is possible to help the phase shift film to have desired optical properties.

After the sputtering process is completed, UV light may be irradiated to the surface of the phase difference adjustment layer. In the sputtering process, Si of the $SiO_2$ matrix constituting the transparent substrate 10 may be substituted to be a transition metal, and O may be substituted to be N. When the sputtering process is continued, a content of the transition metal may exceed the solubility limit and the transition may be disposed in an interstitial site rather than being substituted with Si in the $SiO_2$ matrix. In such a case, the transition metal may form a mixture with elements such as Si, O, and N on the surface of the phase difference adjustment layer to be formed. The mixture may be in a homogeneous state or may be in an inhomogeneous state. When a non-uniform mixture is formed on the surface of the phase difference adjustment layer, a haze defect may be formed on the surface of the phase difference adjustment layer by exposure light having a short wavelength in the exposure process. When the phase shift film is cleaned using sulfuric acid as a cleaning solution to remove the haze, sulfur ions may remain on the surface of the phase difference adjustment layer even after cleaning. The sulfur ions may continuously receive strong energy by exposure light in a wafer exposure process, and the sulfur ions having high energy may react with a non-uniform mixture to generate growth defects on the surface of the phase difference adjustment layer. In the embodiment, the light resistance and chemical resistance of the phase difference adjustment layer can be further improved by irradiating UV light having a controlled wavelength to the surface of the phase difference adjustment layer to uniformize the transition metal and N contents in the mixture of the surface of the phase difference adjustment layer in the in-plane direction.

The phase difference adjustment layer may be treated with light for the surface by irradiating light with a wavelength of 200 nm or less to the phase difference adjustment layer for 5 to 20 minutes using a light source having a power of 2 to 10 $mW/cm^2$.

The phase difference adjustment layer 21 may be heat-treated together with or separately from the UV light irradiation process. The heat treatment may be applied by utilizing the heat generated by UV irradiation or may be performed as separated processes.

The phase difference adjustment layer 21 formed through the sputtering process may have an internal stress. The internal stress may be a compressive stress or a tensile stress depending on the conditions of sputtering. The internal stress of the phase difference adjustment layer may cause warpage of the substrate, and as a result, the resolution of the photomask to which the phase difference adjustment layer is applied may be reduced. In the embodiment, the warpage of the substrate may be reduced by applying a heat treatment to the phase difference adjustment layer.

The protective layer may be formed through a heat treatment process after the phase difference adjustment layer is formed. During the heat treatment process, an atmosphere gas may be introduced into the chamber to form a protective layer on the surface of the phase difference adjustment layer 21. A protective layer may be formed by reaction of the surface of the phase difference adjustment layer with the atmospheric gas in the heat treatment process. However, the manufacturing method for a protective layer is not limited thereto.

The heat treatment process may comprise a temperature increasing operation, a temperature maintaining operation, a cooling operation, and a protective layer forming operation. The heat treatment process may be performed by disposing a blank mask having a phase difference adjustment layer formed on the surface thereof in a chamber and then heating it through a lamp.

In the temperature increasing operation, the atmosphere temperature in the heat treatment chamber may be raised to a set temperature of 150 to 500° C.

In the temperature maintaining operation, the atmosphere temperature in the chamber may be maintained at the set temperature, and the atmosphere pressure in the chamber may be adjusted to be 0.1 to 2.0 Pa. The temperature maintaining operation may be carried out for 5 to 60 minutes.

In the cooling operation, the temperature in the chamber may be lowered from a set temperature to room temperature.

The protective layer forming operation is an operation of forming a protective layer on the surface of the phase shift film by introducing an atmospheric gas comprising a reactive gas into the chamber after the cooling operation is completed. The reactive gas may comprise $O_2$. The gas introduced into the chamber in the protective layer forming step may comprise at least one of $N_2$, Ar, and He. Specifically, in the protective layer forming step, $O_2$ gas may be introduced into the chamber at 0.3 to 2.5 SLM (Standard Liter per Minute). The $O_2$ gas may be introduced into the chamber at 0.5 to 2 SLM. The protective layer forming step may be performed for 10 to 60 minutes. The protective layer forming step may be performed for 12 to 45 minutes. In such a case, the content of each element in the thickness direction of the protective layer may be adjusted to suppress variations in optical properties of the entire phase shift film caused from the formation of the protective layer.

Manufacturing Method of Light Shielding Film

The light shielding film of the embodiment may be formed in contact with the phase shift film, or may be formed in contact with another thin film disposed on the phase shift film.

The light shielding layer may comprise a lower layer and an upper layer disposed on the lower layer.

The sputtering process may use DC power or RF power.

When sputtering the light shielding film, a sputtering target and a sputtering gas may be selected in consideration of the composition of the light shielding film to be formed. When the light shielding film comprises two or more layers, the composition of the sputtering gas applied to each layer comprised in the light shielding film may be applied to be different from each other. When the light shielding film comprises two or more layers, the composition of the sputtering target and the sputtering gas applied to each layer comprised in the light shielding film may be applied to be different from each other.

As the sputtering target, one target comprising chromium may be applied, and two or more targets may be applied simultaneously. The target comprising chromium may comprise chromium in an amount of 90 atom % or more. The target comprising chromium may comprise chromium in an amount of 95 atom % or more. The target comprising chromium may comprise chromium in an amount of 99 atom % or more.

In a case of the sputtering gas, the composition of the sputtering gas may be adjusted in consideration of the composition of elements constituting each layer of the light shielding film, the density of the light shielding film, optical properties, and the like.

The sputtering gas may comprise a reactive gas and an inert gas. By adjusting the content of the reactive gas and the inert gas in the sputtering gas, the optical properties and density of the light shielding film to be formed can be controlled. The reactive gas may comprise $CO_2$, $O_2$, $N_2$, $NO_2$, and the like. The reactive gas may further comprise other gases in addition to the gases described above. The inert gas may comprise Ar, He, Ne, and the like. The inert gas may further comprise other gases in addition to the gases described above.

When the lower layer of the light shielding layer is formed, a sputtering gas comprising Ar, $N_2$, He and $CO_2$ may be injected into the chamber. Specifically, the sputtering gas having the sum of the flow rates of $CO_2$ and $N_2$ compared to a total flow rate of the sputtering gas, which is 40% or more, may be injected into the chamber. In such a case, the lower layer of the light shielding film can have a desired optical characteristic, and may contribute to a desired TFT2 value of the light shielding film.

When the upper layer of the light shielding layer is formed, a sputtering gas comprising Ar and $N_2$ may be injected into the chamber. Specifically, a sputtering gas having a flow rate of $N_2$ which is 30% or more compared to a total flow rate of the sputtering gas may be injected into the chamber. In such a case, it can contribute to controlling the dimensional change in the thickness direction according to the temperature change of the light shielding film.

Each gas comprised in the sputtering gas may be mixed and injected into the sputtering chamber. Each gas comprised in the sputtering gas may be individually injected through different inlets in the sputtering chamber.

A magnet may be disposed in the chamber to control the density and the uniformity of in-plane optical properties of the light shielding film to be formed. The method of installing the magnet is omitted because it overlaps with the case of the phase shift film. The rotation speed of the magnet can be applied to 50 to 200 rpm.

In the sputtering process, the T/S distance, which is the distance between the target and the substrate, and the angle between the substrate and the target can be simultaneously adjusted. When each layer of the light shielding film is formed, the T/S distance may be 240 to 300 mm. The angle between the substrate and the target may be 20 to 30 degrees. In such a case, the film-forming speed is stably controlled, and it is possible to suppress an excessive increase in the internal stress of the light shielding film to be formed.

In the sputtering process, the rotation speed of the substrate having the film-forming target surface can be adjusted. When each layer in the light shielding film is formed, the rotation speed of the substrate having the film-forming target surface may be 2 to 50 RPM. The rotation speed of the substrate may be 10 to 40 RPM. In such a case, each layer of the formed light shielding film can further improve the uniformity of the optical properties and the TFT2 values in the in-plane direction.

When the light shielding film 30 is formed, the intensity of electric power applied to the sputtering target may be adjusted. A discharge region comprising a plasma atmosphere in the chamber may be formed by supplying electric power to a target located in the sputtering chamber. By controlling the magnetic field strength and the magnet rotation speed and simultaneously adjusting the intensity of the sputtering electric power, the density of the light shielding film to be formed can be adjusted.

The intensity of electric power applied to the sputtering target during the formation of the lower layer of the light shielding film may be 0.5 to 2 kW. The intensity of the electric power may be 1.0 to 1.8 kW. The intensity of the electric power may be 1.2 to 1.5 kW. The intensity of the electric power applied to the sputtering target during the formation of the upper layer of the light shielding film may be 1 to 3 kW. The intensity of the electric power may be 1.3 to 2.5 kW. The intensity of the electric power may be 1.5 to 2.0 kW. In such a case, it is possible to suppress excessive variation of the dimensional value of the light shielding film in the thickness direction according to the temperature change.

A spectroscopic ellipsometer can be installed in the sputtering equipment. Through this, the film formation time can be controlled while the optical properties of the light shielding film 30 to be formed are monitored. The method of installing a spectroscopic ellipsometer in the sputtering equipment and measuring the optical properties of the light shielding film is omitted because it is overlapped with the above description.

When the lower layer of the light shielding film 30 is formed, sputtering may be performed until the Photon energy in a point having a phase difference of 140° between P wave and S wave of reflected light measured by a spectroscopic ellipsometer becomes 1.6 to 2.2 eV. When the lower layer of the light shielding film 30 is formed, sputtering may be performed until the Photon energy is a point having a phase difference of 140° between P wave and S wave of reflected light measured by a spectroscopic ellipsometer becomes 1.8 to 2.0 eV.

When the upper layer of the light shielding film 30 is formed, sputtering may be performed until the Photon energy at the point where the phase difference between the P wave and the S wave of reflected light measured by a spectroscopic ellipsometer is 140° becomes 1.7 to 3.2 eV. When the upper layer of the light shielding film 30 is formed, sputtering may be performed until the Photon energy in a point having a phase difference of 140° between P wave and S wave of reflected light measured by a spectroscopic ellipsometer becomes 2.5 to 3.0 eV.

In such a case, the formed light shielding film can help to block the exposure light effectively.

Photomask

A photomask (not shown) according to another embodiment of the present disclosure comprises a transparent substrate; a phase shift pattern film disposed on the transparent substrate; and a light shielding pattern film disposed on the phase shift film.

The photomask has a TFT3 value of 0.25 μm/100° C. or less, expressed by Equation 3 below.

$$TFT3 = \frac{\Delta pPM}{T2 - T1} \quad \text{[Equation 3]}$$

Here, when the thermal variation of the processed photomask, which is formed by processing the thickness of the transparent substrate of the photomask to be 0.6 mm and removing the light shielding pattern film, is analyzed by a thermomechanical analyzer, the measuring temperature of the thermomechanical analyzer is increased from the T1 to the T2, and ΔpPM is a position change of the upper surface of the phase shift pattern film at the T2 in the thickness direction based on the upper surface of the phase shift pattern film at T1.

A photomask (not shown) according to another embodiment of the present disclosure comprises a transparent substrate; a phase shift pattern film disposed on the transparent substrate; and a light shielding pattern layer disposed on the phase shift film.

The photomask may have the Photon energy of the incident light in a point having Del_1 of 0 expressed by Equation 5 below is 4.0 to 5.0 eV, when $PE_1$ value is 3.0 eV and $PE_2$ value is 5.0 eV.

$$Del\_1 = \lim_{\Delta PE \to 0} \left( \frac{\Delta pDPS}{\Delta PE} \right) \quad \text{[Equation 5]}$$

In the Equation 5 above, the pDPS value is a value of the phase difference between P wave and S wave of reflected light if the phase difference between P wave and S wave of the reflected light is 180° or less, or a value of subtracting the phase difference between P wave and S wave of the reflected light from 360° if the phase difference between P wave and S wave of the reflected light is more than 180°, when the light shielding film is removed from the photomask and the surface of the phase shift film is measured with a spectroscopic ellipsometer by applying an incident angle to be 64.5°.

The photomask may be manufactured using the blank mask described above. In detail, the photomask may be manufactured by patterning the phase shift film and the light shielding film of the blank mask.

Descriptions of thermal variation characteristics and optical properties of the phase shift pattern film and the light shielding pattern film are overlapped with the descriptions of thermal variation characteristics and optical properties of the phase shift film and light shielding film described above, and thus will be omitted.

Hereinafter, example will be described in further detail.

Manufacture Example: Formation of Phase Shift Film and Light Shielding Film

Example 1: A quartz transparent substrate having a width of 6 inches, a length of 6 inches, and a thickness of 0.25 inches was disposed in the chamber of DC sputtering equipment. A target comprising molybdenum and silicon in an atomic ratio of 1:9 was disposed in the chamber so that the T/S distance was 255 mm and the angle between the substrate and the target was 25 degrees. A magnet having a magnetic force of 40 mT was disposed on the rear surface of the target.

After that, a sputtering gas mixed in a ratio of $Ar:N_2$:He=9:52:39 was introduced into the chamber, the sputtering electric power was 2 kw, and the sputtering process was performed while rotating the magnet. At this time, the rotation speed of the magnet was increased from 100 rpm to a maximum of 150 rpm by 10 rpm per minute. The area in which a phase shift film is formed was limited to the area set by the width of 132 mm and the length of 132 mm on the surface of the transparent substrate. The sputtering process was performed until the Photon energy in a point having Del_1 value of 0 according to Equation 1 above is became 2.0 eV measured from the phase shift film under sputtering.

After sputtering, the surface of the phase shift film of the blank mask was exposed to Excimer UV light with a wavelength of 172 nm. At this time, the optical power of the UV light was increased to a maximum of 7 mW/cm² by 3 mW/cm² per minute and was maintained at the power of 7 mW/cm² for 5 minutes.

Thereafter, the blank mask was introduced into a chamber for a heat treatment process, annealed at 1 Pa, and then cooled naturally. The temperature in the annealing process was increased from room temperature to a maximum of 400° C. by 50° C. per minute, and was maintained at the maximum temperature for about 30 minutes. After natural cooling, $O_2$ gas in the chamber for the heat treatment process was introduced into the chamber at a rate of 1 SLM for 30 minutes. The temperature of 02 gas was about 300° C.

A light shielding film sputtering process was performed on the surface of the formed phase shift film. In detail, the substrate on which the phase shift film were formed and a chromium target was disposed in the sputtering chamber so that the T/S distance was 255 mm and the angle between the substrate and the target was 25 degrees. A magnet having a magnetic field of 40 mT was disposed on the rear surface of the target.

A sputtering gas having a flow ratio of $Ar:N_2:He:CO_2$=19:11:34:37 was injected into the chamber. After that, the sputtering electric power was applied to be 1.35 kw, and the sputtering process was performed until the Photon energy in a point having the phase difference of the reflected light between P wave and S wave of 140° became 1.8 to 2.0 eV measured from a lower layer of the light shielding film under sputtering to form the lower layer of the light shielding film. Sputtering was performed while the magnet is subject to rotate. At this time, the rotation speed of the magnet was increased from initial 100 rpm to a maximum of 150 rpm by 10 rpm per minute.

After the lower layer of the light shielding film was formed, a sputtering gas having a flow ratio of Ar:$N_2$=57:43 was injected into the chamber. After that, and the sputtering was performed until the Photon energy in a point having the phase difference of the reflected light between P wave and S wave of 140° became 2.75 to 2.95 eV measured from a upper layer of the light shielding film. Sputtering was performed while sputtering electric power was applied to be 1.85 kW and the magnet was subject to rotate.

Two samples in total were prepared by applying the film-forming conditions as described above.

Example 2: While it was manufactured under the same condition as Example 1, the magnetic force of a magnet was applied to be 45 mT when the phase shift film and the light shielding film were formed, and the formation time of the phase shift film was applied as the time until the Photon energy in a point having a Del_2 value of 0 according to the Equation 1 became 1.89 eV.

Example 3: While it was manufactured under the same condition as Example 1, the composition of the sputtering gas was changed to be a ratio of Ar:$N_2$:He=8:58:34 when the phase shift film was formed.

Example 4: While it was manufactured under the same condition as Example 1, when the phase shift film and the light shielding film were formed, the magnetic force of a magnet of 42 mT and the rotation speed of the magnet of 150 rpm were applied, and the formation of the lower layer of the light shielding film was performed for the time until the Photon energy in a point having the phase difference of the reflected light between P wave and S wave of 140° became 1.9 eV. In addition, the electric power for sputtering was applied to be 2.75 kW when the upper layer of the light shielding film was formed, and the sputtering was performed for the time until the Photon energy in a point having the phase difference of the reflected light between P wave and S wave of 140° became 1.9 eV.

Example 5: While it was manufactured under the same condition as Example 4, the magnetic force of a magnet was applied to be 48 mT, and the formation of the phase shift film was performed until the Photon energy in a point having the Del_2 value of 0 became 1.89 eV.

Example 6: While it was manufactured under the same condition as Example 4, except that the ratio of the gas included in the sputtering gas was changed to Ar:$N_2$:He=8:58:34 during the formation of the phase shift film. In addition, the magnetic force of a magnet was applied to be 37 mT during the formation of the phase shift film and the light shielding film.

Comparative Example 1: While it was manufactured under the same condition as Example 1, when the phase shift film and the light shielding film were formed, the magnetic force of a magnet was applied to be 60 mT, the rotation speed of the magnet was applied to be 100 rpm, and UV light irradiation and heat treatment were not applied to the phase shift film.

Comparative Example 2: While it was manufactured under the same condition as Comparative Example 1, the magnetic force of a magnet of 20 mT was applied.

Comparative Example 3: While it was manufactured under the same condition as Example 4, when the phase shift film and the light shielding film were formed, the magnetic force of a magnet was applied to be 63 mT, the rotation speed of the magnet was applied to be 100 rpm, and UV light irradiation and heat treatment were not applied to the phase shift film.

Comparative Example 4: While it was manufactured under the same condition as Comparative Example 3, the ratio of the gas comprised in the sputtering gas during the formation of the phase shift film was changed to Ar:$N_2$:He=8:58:34. In addition, the magnetic force a magnet of 23 mT was applied during the formation of the phase shift film and the light shielding film.

Evaluation Example: Measurement of Thermal Variation

The blank masks of Examples 1 to 3 and Comparative Examples 1 and 2 were cut to a size of 1 cm×1 cm, and in the cut blank masks, a surface opposite to the surface where the phase shift film was formed within the transparent substrate was etched. The thickness of the transparent substrate after being etched was 0.6 mm.

After the transparent substrate was etched, the TFT2 values of Examples and Comparative Examples were measured through a thermomechanical analyzer. In detail, after the samples of each Example and Comparative Example were placed in the thermomechanical analyzer of the Q400 model available from TA INSTRUMENT, a tip thereof was placed on a measuring target sample. Thereafter, the tip load was set to be 0.05N, the temperature increased to be 10° C./min, the measuring temperature range was set to be 30 to 200° C., and thereby the measurement was made.

The light shielding film of each sample of Examples and Comparative Examples in which the TFT2 value was measured was removed. Specifically, the light shielding film was removed by etching using a chlorine-based gas as an etchant. Thereafter, TFT1 values of Examples and Comparative Examples were measured through a thermomechanical analyzer. The measurement condition was applied to be the same as the condition applied when the TFT2 value was measured.

Figure 4:
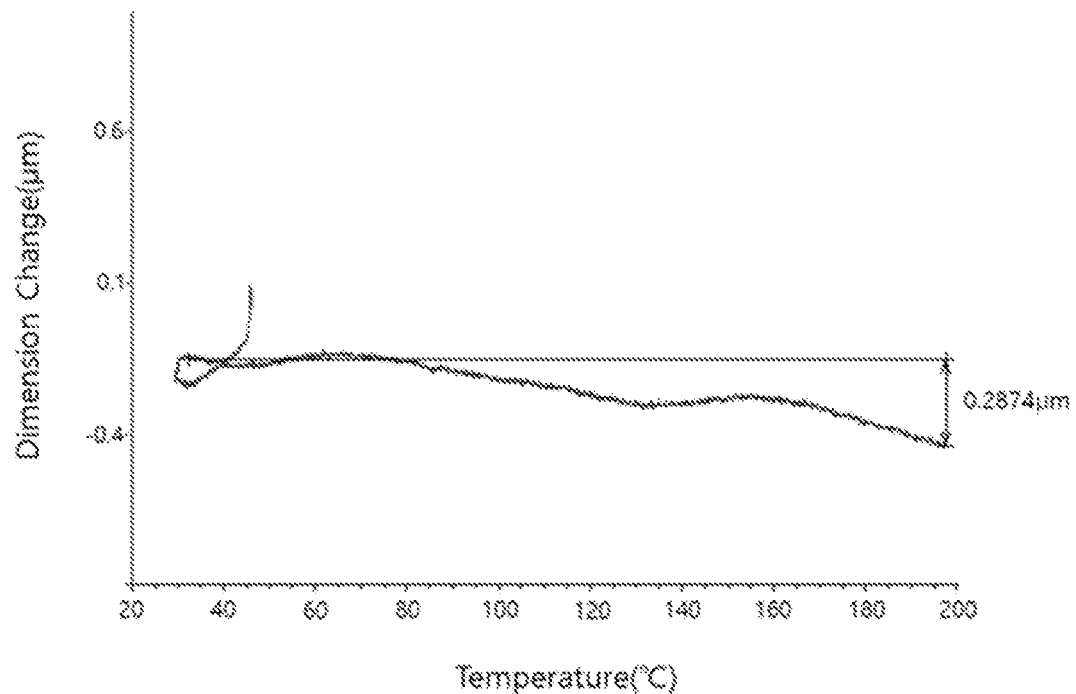
FIG. 4 is a graph for illustrating a thermal variation value in the thickness direction depending on the temperature of a phase shift film of Example 1.
Figure 5:
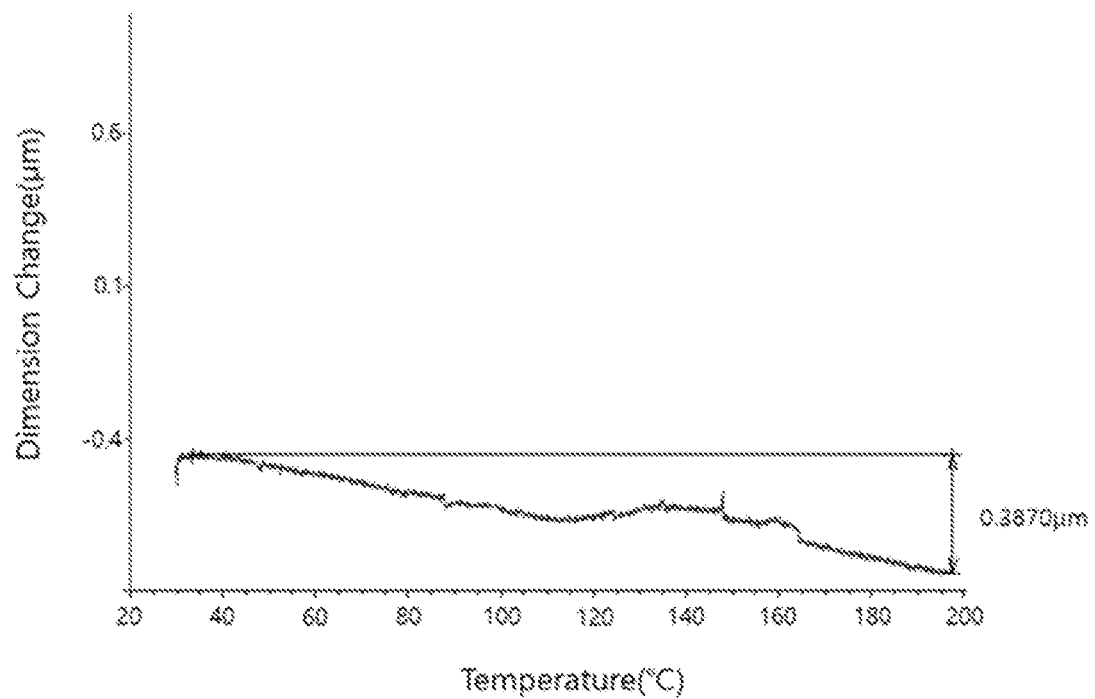
FIG. 5 is a graph for illustrating a thermal variation value in the thickness direction depending on the temperature of a phase shift film of Example 2.
Figure 6:
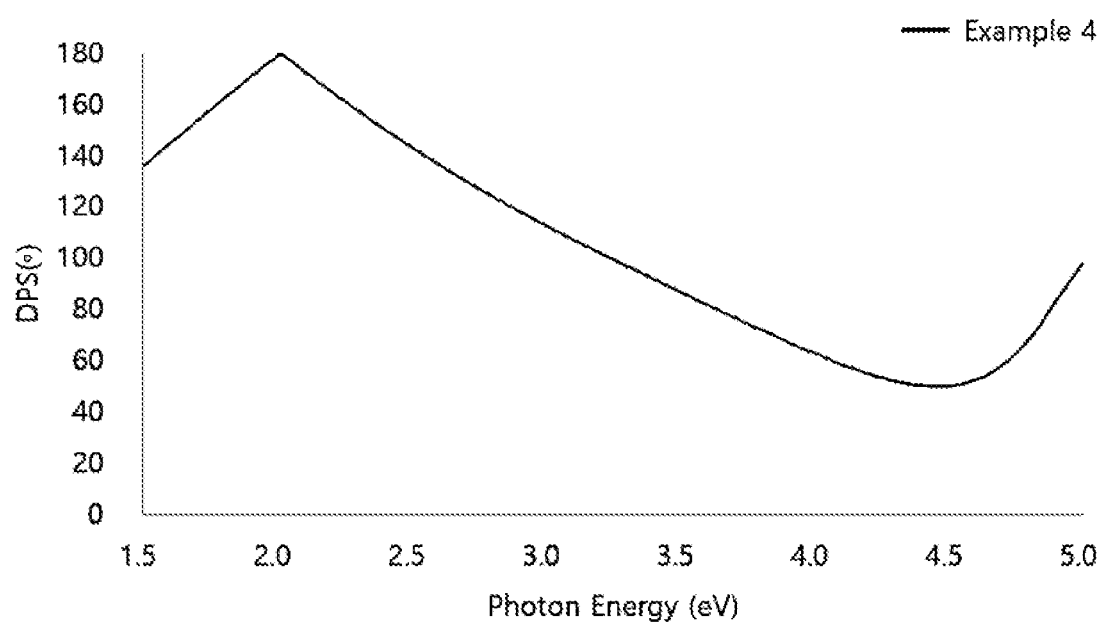
FIG. 6 is a graph of measuring distribution of DPS values depending on Photon energy of Examples 4.
Figure 7:
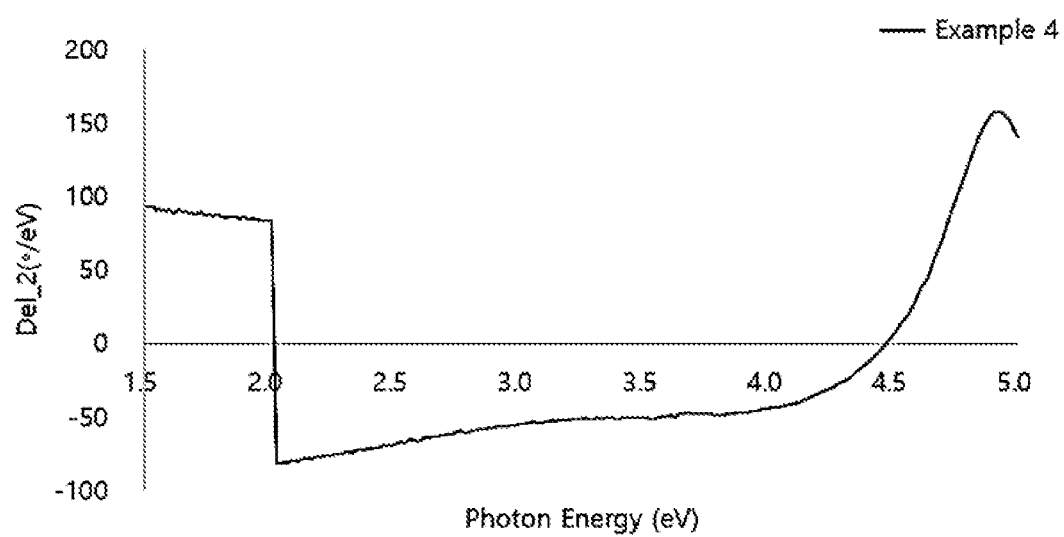
FIG. 7 is a graph of measuring distribution of Del_2 values depending on Photon energy of Example 4.
Figure 8:
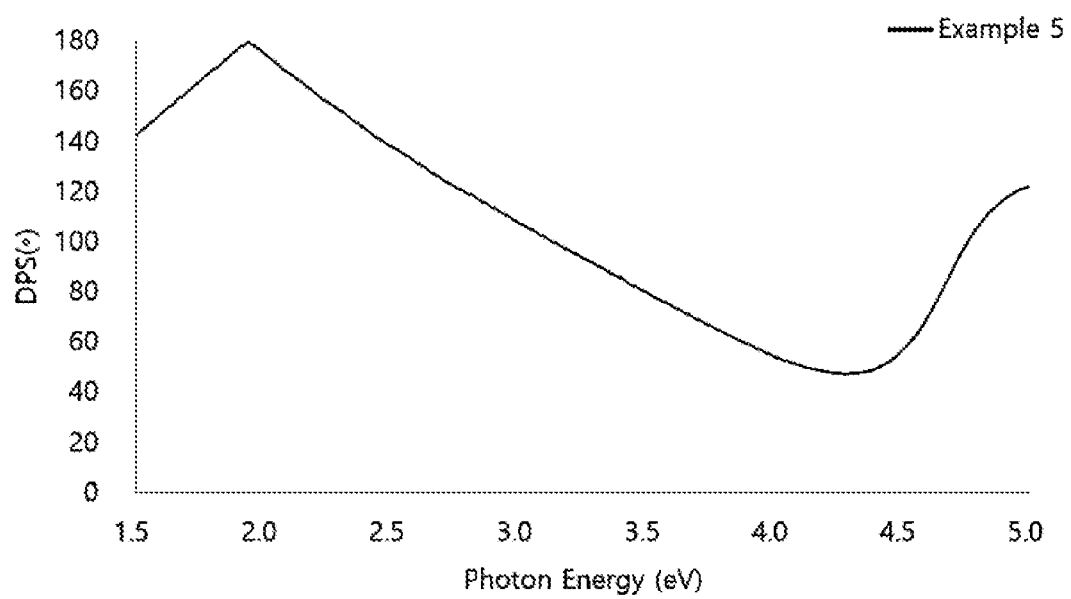
FIG. 8 is a graph of measuring distribution of DPS values depending on Photon energy of Examples 5.
Figure 9:
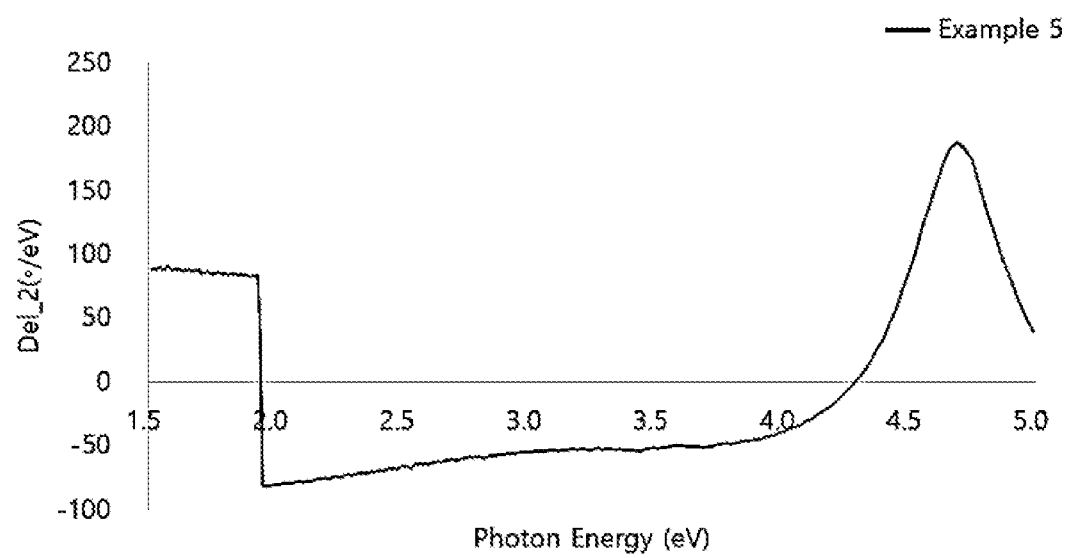
FIG. 9 is a graph of measuring distribution of Del_2 values depending on Photon energy of Example 5.
Figure 10:
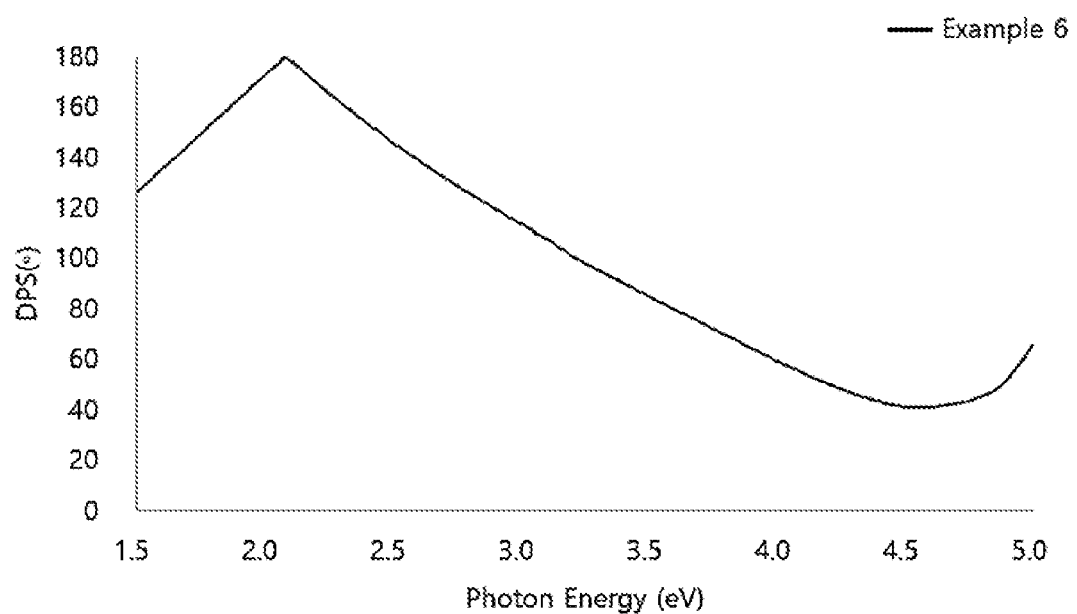
FIG. 10 is a graph of measuring distribution of DPS values depending on Photon energy of Examples 6.
Figure 11:
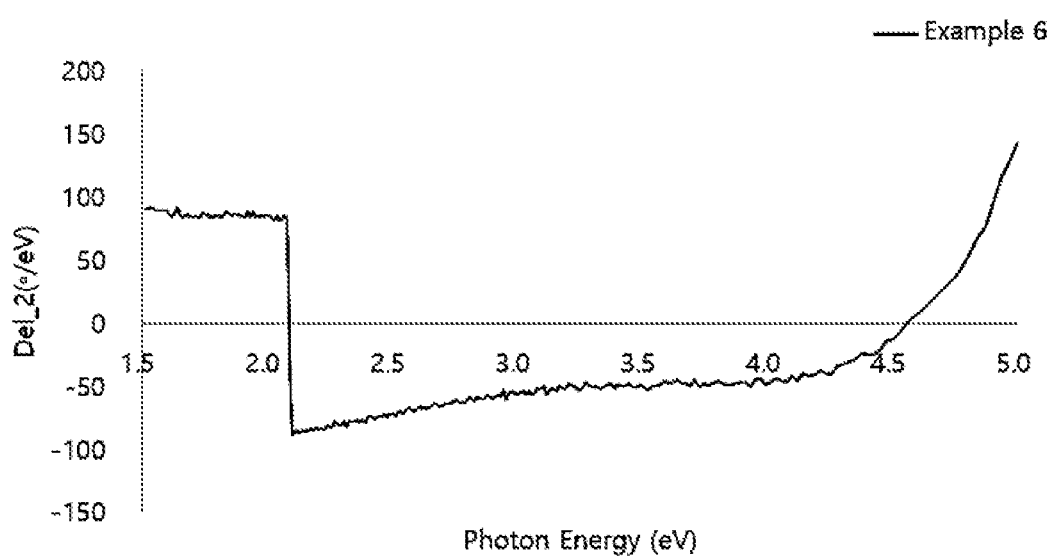
FIG. 11 is a graph of measuring distribution of Del_2 values depending on Photon energy of Example 6.
Figure 12:
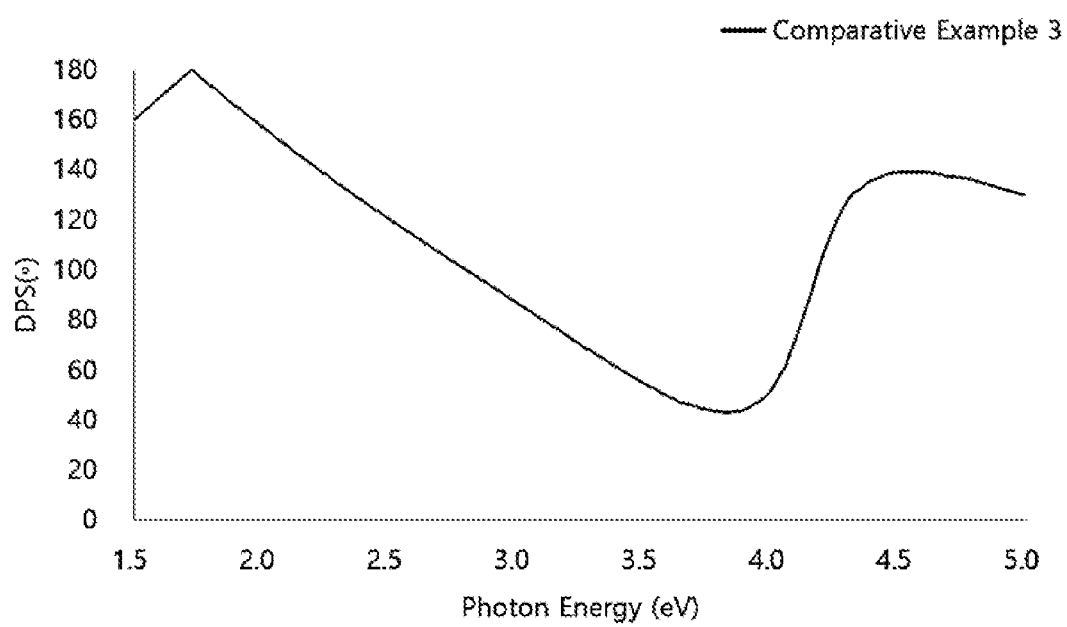
FIG. 12 is a graph of measuring distribution of DPS values depending on Photon energy of Comparative Examples 3.
Figure 13:
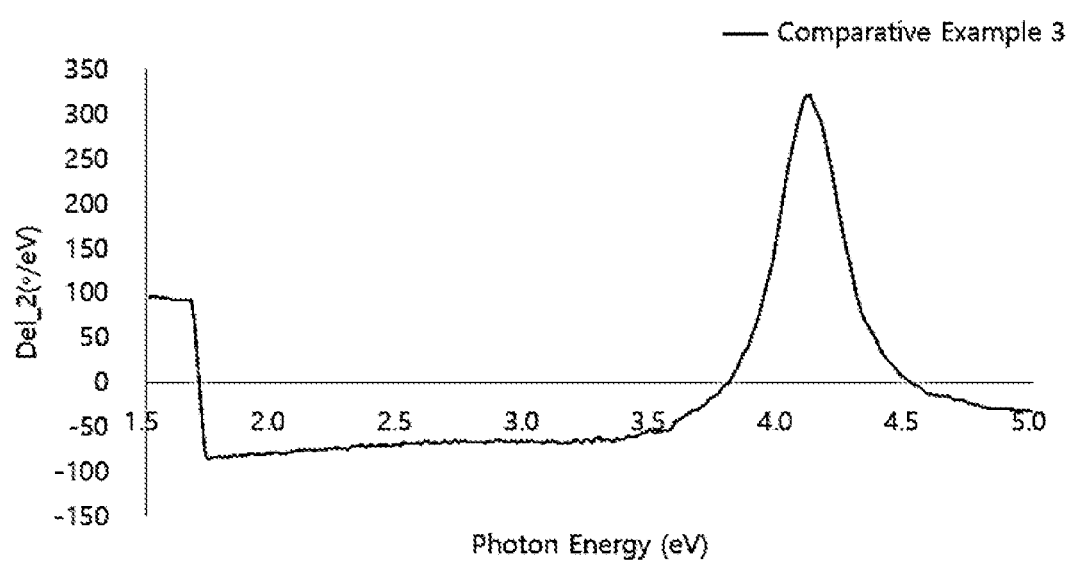
FIG. 13 is a graph of measuring distribution of Del_2 values depending on Photon energy of Comparative Examples 3.
Figure 14:
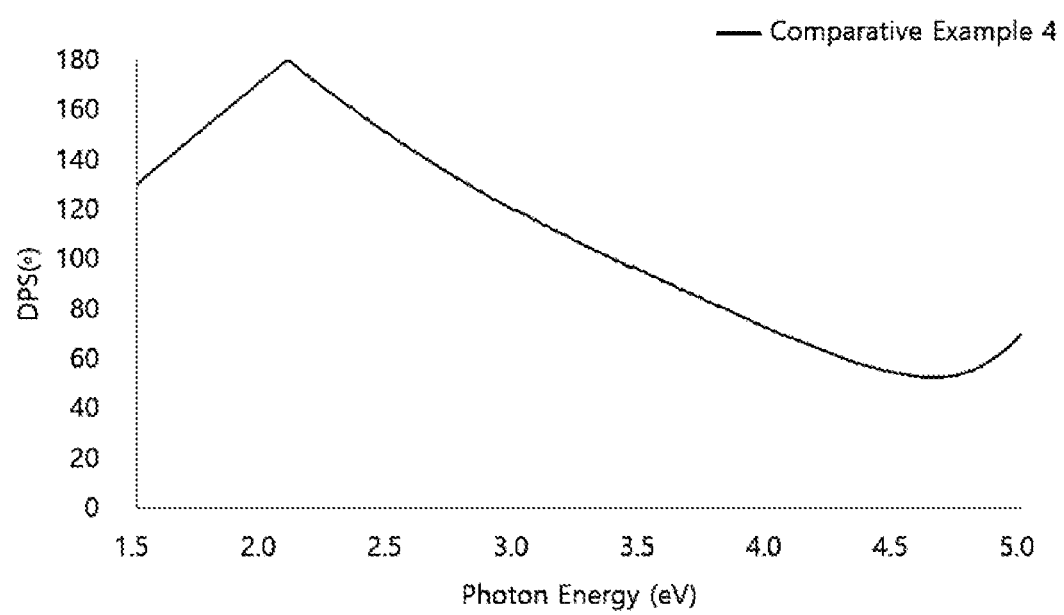
FIG. 14 is a graph of measuring distribution of DPS values depending on Photon energy of Comparative Examples 4.
Figure 15:
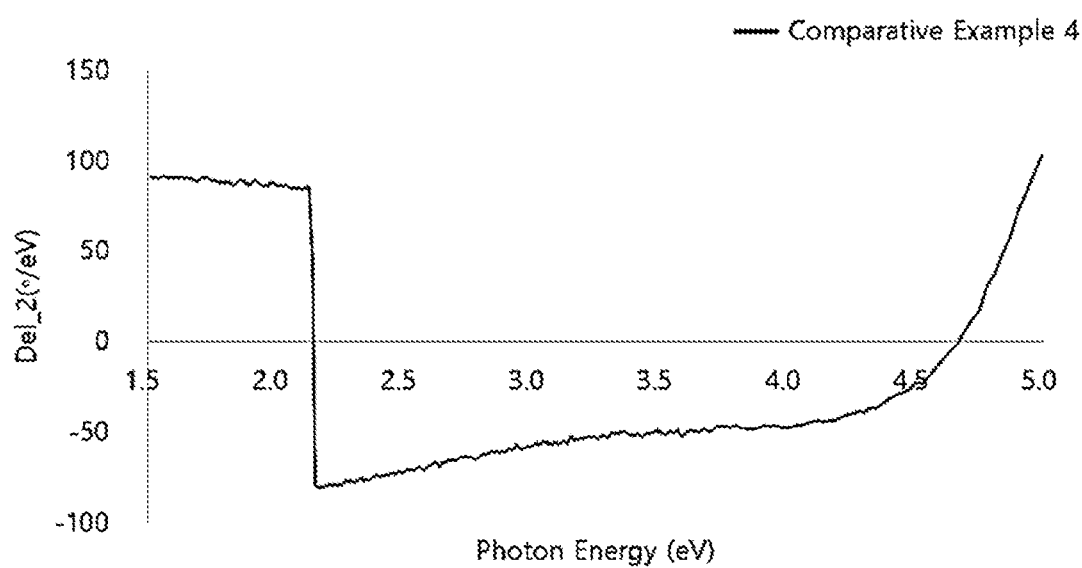
FIG. 15 is a graph of measuring distribution of Del_2 values depending on Photon energy of Comparative Examples 4.

A graph of the thermal variation in the thickness direction of the phase shift film according to the temperature of Example 1 was shown in FIG. 4, and a graph of the thermal variation in the thickness direction of the phase shift film according to the temperature of Example 2 was shown in FIG. 5. In addition, the calculation results of the TFT1 and TFT2 were shown in Table 1 below.

Evaluation Example: Evaluation of Optical Properties of Phase Shift Film Measured with Ellipsometer The light shielding films of the samples of Examples and Comparative Examples were removed by etching. Del_2 value distribution, phase difference, and transmittance were measured for each Example and Comparative Example using a spectroscopic ellipsometer (MPM193 product available from LASERTEC). When the phase difference and transmittance were measured, the wavelength of the exposure light was applied to be 193 nm. The measurement results for each Example and Comparative Example were shown in Tables 2 and 3 below. In addition, graphs showing the distribution of DPS values and Del_2 values measured in Examples 4 to 6 and Comparative Examples 3 and 4 were shown in FIGS. 6 to 15.

Evaluation Example: Measurement of Contrast and CD Value

After a photoresist film was formed on the surface of the phase shift film of each sample of Examples and Comparative Examples, a dense quadrangle pattern was exposed on the surface of the photoresist film using EBM 9000 model available from NUFLARE. The target CD value of the quadrangle pattern was set to be 400 nm (4×). After a pattern was formed on the photoresist film of each sample, the light shielding film and the phase shift film were etched according to the developed pattern shape using Tetra X model available from APPLIED MATERIAL. Thereafter, the photoresist pattern was removed.

The contrast and normalized CD values of the patterns developed through the exposure process were measured and calculated using AIMS 32 model available from CARL ZEISS for the sample of each Example and Comparative Example comprising the phase shift pattern film. For measurement and calculation, the numerical aperture (NA) was set to be 1.35, the illumination system was set to be crosspole of 30×, outer sigma of 0.8, and in/out sigma ratio of 85%. The measured data were shown in Table 3 below.

Evaluation Example: Measurement Evaluation of Each Element Content in the Thickness Direction of Protective Layer For the samples of Examples 4 to 6 and Comparative Examples 3 and 4, the content of each element in the thickness direction of the protective layer was measured. Specifically, the analyzer type/channel was applied to be 180 degrees double focusing hemispherical analyzer/120 channel, the X-ray light source was applied to be Al Kα microfocused, the power was applied to be 1 keV, the working pressure was applied to be 1E-7 mbar, the gas was applied to be Ar using in order to measure the content of each element in the thickness direction of the protective layer using K-alpha model available from THERMO SCIENTIFIC.

As a result of the measurement, when the protective layer comprised a region in which the ratio of nitrogen content to oxygen content in the thickness direction was 0.4 to 2 and the region had a thickness of 30 to 80% compared to a total thickness of the protective layer, it was evaluated as O, or when the region had a thickness of less than 30% or more than 80% compared to a total thickness of the protective layer, it was evaluated as X. The measurement results were shown in Table 3 below.

TABLE 1

| | T1(°) | T2 (° C.) | ΔPM (μm) | ΔPC (μm) | TFT1 (μm/100° C.) | TFT2 (μm/100° C.) |
|---|---|---|---|---|---|---|
| Example 1 | 30 | 200 | 0.2874 | 0.1075 | 0.1691 | 0.0632 |
| | 50 | 150 | 0.143 | 0.210 | 0.143 | 0.210 |
| | 50 | 100 | 0.001 | 0.032 | 0.003 | 0.094 |
| Example 2 | 30 | 200 | 0.3870 | 0.268 | 0.2276 | 0.158 |
| | 50 | 150 | 0.190 | 0.231 | 0.190 | 0.231 |
| Example 3 | 30 | 200 | 0.319 | 0.227 | 0.188 | 0.133 |
| | 50 | 150 | 0.185 | 0.223 | 0.185 | 0.223 |
| Example 4 | — | — | — | — | — | — |
| Example 5 | | | | | | |
| Example 6 | | | | | | |
| Comparative Example 1 | 30 | 200 | 0.452 | 0.446 | 0.266 | 0.262 |
| | 50 | 150 | 0.311 | 0.298 | 0.311 | 0.298 |
| Comparative Example 2 | 30 | 200 | 0.522 | 0.463 | 0.307 | 0.272 |
| | 50 | 150 | 0.276 | 0.296 | 0.276 | 0.296 |
| Comparative Example 3 | — | — | — | — | — | — |
| Comparative Example 4 | — | — | — | — | — | — |

TABLE 2

| | Photon Energy in a Point having Del_2 value of 0 when $PE_1$ is 1.5 eV and $PE_2$ is 3 eV (eV) | Photon Energy in a Point having Del_2 value of 0 when $PE_1$ is 3 eV and $PE_2$ is 5 eV (eV) | Average value of Del_2 when $PE_1$ is 1.5 eV and $PE_2$ is S* (°/eV) | Average value of Del_2 when $PE_1$ is S* and $PE_2$ is B* (°/eV) | Average value of Del_2 when $PE_1$ is B* and $PE_2$ is 5 eV (°/eV) | Maximum value of Del_2 when $PE_1$ is 1.5 eV and $PE_2$ is 5 eV (°/eV) |
|---|---|---|---|---|---|---|
| Example 1 | 2.00 | 4.44 | — | — | — | — |
| Example 2 | 1.89 | 4.31 | — | — | — | — |
| Example 3 | 2.09 | 4.65 | — | — | — | — |
| Example 4 | 2.02 | 4.46 | 86.5 | −57.3 | 91.6 | 157.5 |
| Example 5 | 1.95 | 4.28 | 82.1 | −58.5 | 102.2 | 187.3 |
| Example 6 | 2.09 | 4.58 | 94.2 | −57.0 | 84.0 | 143.7 |
| Comparative Example 1 | 1.65 | 3.84 | — | — | — | — |
| Comparative Example 2 | 2.17 | 4.80 | — | — | — | — |
| Comparative Example 3 | 1.71 | 3.79 | 75.0 | −66.8 | −21.8 | 320.0 |
| Comparative Example 4 | 2.15 | 4.65 | 98.3 | −53.5 | 58.1 | 103.5 |

*S* means the minimum value among Photon energies of incident light in a point having the Del_2 value of 0.
*B* means the maximum value among Photon energies of incident light in a point having the Del_2 value of 0.

TABLE 3

|  | Transmittance (%) | Phase difference (°) | Normalized Contrast | Normalized CD | Evaluation of the Composition of Each Element of Protective Layer in the Thickness Direction |
|---|---|---|---|---|---|
| Example 1 | 6.1 | 178.5 | 1.000 | 0.99 | — |
| Example 2 | 5.4 | 186.1 | 0.989 | 1.01 | — |
| Example 3 | 6.9 | 172.4 | 0.959 | 1.03 | — |
| Example 4 | 6.1 | 175.7 | 1.000 | 1.00 | O |
| Example 5 | 5.6 | 181.0 | 0.992 | 1.01 | O |
| Example 6 | 6.4 | 172.6 | 0.977 | 1.02 | O |
| Comparative Example 1 | 3.4 | 209.1 | 0.929 | 1.06 | — |
| Comparative Example 2 | 7.8 | 166.0 | 0.883 | 1.10 | — |
| Comparative Example 3 | 3.3 | 205.3 | 0.918 | 1.05 | X |
| Comparative Example 4 | 7.4 | 162.0 | 0.895 | 1.08 | X |

In the Table 1, all the TFT1 and TFT2 values for each measurement condition of Examples 1 to 3 showed a value of 0.25 μm/100° C. or less, but all the TFT1 and TFT2 values for each measurement condition of Comparative Examples 1 and 2 showed a value greater than 0.25 μm/100° C.

In the Table 3, the transmittance of Examples 1 to 3 was within the range of 5.4 to 6.9%, and the phase difference was within the range of 170 to 190°, but Comparative Examples 1 and 3 had transmittance less than 4%, and the phase difference of 200° or more, and Comparative Examples 2 and 4 had transmittance of 7% or more and the phase difference less than 170°. Through this, it can be ascertained that the phase shift film with the adjusted Del_2 value distribution exhibits optical properties close to the desired transmittance (6%) and phase difference (180 degrees) for exposure light with a short wavelength.

Examples 1 to 6 showed a normalized contrast of 0.95 or more and a normalized CD value of less than 1.05, whereas Comparative Examples 1 to 4 showed a normalized contrast less than 0.93 and a normalized CD value of 1.05 or more.

In the evaluation of the composition for each element in the thickness direction of the protective layer, Examples 4 to 6 were evaluated as O, whereas Comparative Examples 3 and 4 were evaluated as X.

Although the exemplary embodiments have been described in detail, the scope of the present invention is not limited thereto, and modifications and alterations made by those skilled in the art using the basic concept of the present invention defined in the following claims fall within the scope of the present invention.

DESCRIPTION OF FIGURE NUMBERS

100: Blank Mask
10: Transparent Substrate
20: Phase shift Film 21: Phase difference Adjustment Layer 22: Protective Layer
30: Light shielding Film
θ: Angle of Incidence N: Normal Line
$L_i$: Incident light $L_r$: Reflected Light
P: P wave Component of Incident Light S: S wave Component of Incident Light
P': P wave Component of reflected light S': S wave Component of Reflected Light
Δ: Phase difference between P wave and S wave of Reflected Light

What is claimed is:

1. A blank mask comprising:
a transparent substrate;
a phase shift film disposed on the transparent substrate; and
a light shielding film, consisting of a lower layer and an upper layer of CrN, with the lower layer disposed on the phase shift film;
wherein the lower layer of the light shielding film comprises oxygen in an amount of 25 to 40 atom %,
wherein the upper layer of the light shielding film is formed by sputtering with a sputtering gas having a flow rate of $N_2$ which is 30% or more compared to a total flow rate of the sputtering gas,
wherein the phase shift film comprises molybdenum;
wherein the phase shift film has a transmittance of 4 to 8% for ArF light,
wherein the phase shift film comprises a phase difference adjustment layer comprising a surface containing nitrogen and the molybdenum in a uniform mixture in the in-plane direction of the surface, and
wherein a TFT1 value expressed by Equation 1 below is 0.25 μm/100° C. or less;

$$TFT1 = \frac{\Delta PM}{T2 - T1} \quad \text{[Equation 1]}$$

where, when the thermal variation of the processed blank mask, which is formed by processing the thickness of the transparent substrate of the blank mask to be 0.6 mm and removing the light shielding film, is analyzed in a thermomechanical analyzer,
the measuring temperature of the thermomechanical analyzer is increased from the T1 to the T2, and
the ΔPM is a position change of the upper surface of the phase shift film in the thickness direction at the T2, based on a position of the upper surface of the phase shift film at the T1.

2. The blank mask of claim 1,
wherein the TFT1 value is 0.2 μm/100° C. or less, when the T1 is 50° C. and the T2 is 80° C.

3. The blank mask of claim 1,
wherein the TFT1 value is 0.2 μm/100° C. or less, when the T1 is 50° C. and the T2 is 150° C.

4. The blank mask of claim 1,
wherein a Photon energy in a point having a Del_2 value of 0 according to Equation 3 below is 1.8 eV to 2.14 eV, when $PE_1$ value is 1.5 eV and $PE_2$ value is 3.0 eV;

$$\text{Del\_2} = \lim_{\Delta PE \to 0} \left( \frac{\Delta DPS}{\Delta PE} \right) \quad \text{[Equation 3]}$$

where in the Equation 3,
the DPS value is, when the light shielding film is removed from the blank mask and the surface of the phase shift film is measured with a spectroscopic ellipsometer by applying an incident angle to be 64.5°, the phase difference between P wave and S wave of reflected light if the phase difference between the P wave and the S wave of the reflected light is 180° or less, or a value of subtracting the phase difference between the P wave and the S wave of the reflected light from 360° if the phase difference between the P wave and the S wave of the reflected light is more than 180°, and the PE value is the Photon energy of incident light within a range of the $PE_1$ value to the $PE_2$ value.

5. The blank mask of claim 1,
wherein a Photon energy in a point having a Del_2 value of 0 according to Equation 3 below is 3.8 eV to 4.64 eV, when $PE_1$ value is 3 eV and $PE_2$ value is 5 eV;

$$Del\_2 = \lim_{\Delta PE \to 0}\left(\frac{\Delta DPS}{\Delta PE}\right) \qquad \text{[Equation 3]}$$

where in the Equation 3,
the DPS value is, when the light shielding film is removed from the blank mask and the surface of the phase shift film is measured with a spectroscopic ellipsometer by applying an incident angle to be 64.5°, the phase difference between P wave and S wave of reflected light if the phase difference between the P wave and the S wave of the reflected light is 180° or less, or a value of subtracting the phase difference between the P wave and the S wave of the reflected light from 360° if the phase difference between the P wave and the S wave of the reflected light is more than 180°, and
the PE value is the Photon energy of incident light within a range of the $PE_1$ value to the $PE_2$ value.

6. The blank mask of claim 1,
wherein the phase shift film comprises the phase difference adjustment layer and a protective layer having a total thickness of 35 Å to 45 Å disposed on the phase difference adjustment layer,
wherein the phase shift film further comprises silicon, oxygen and nitrogen,
wherein the phase difference adjustment layer comprises nitrogen in an amount of 40 to 60 atom %,
wherein the protective layer comprises nitrogen in an amount of 20 to 40 atom %,
wherein the protective layer comprises a surface region in which the ratio of nitrogen content to oxygen content in the thickness direction is 0.4 to 2, and the surface region has a thickness of 45 to 55% compared to the total thickness of the protective layer.

7. The blank mask of claim 6,
wherein the ratio of the thickness of the protective layer to the thickness of the phase shift film is 0.04 to 0.09.

8. A blank mask comprising:
a transparent substrate;
a phase shift film disposed on the transparent substrate; and
a light shielding film, consisting of a lower layer and an upper layer of CrN, with the lower layer disposed on the phase shift film;
wherein the lower layer of the light shielding film comprises oxygen in an amount of 25 to 40 atom %,
wherein the upper layer of the light shielding film is formed by sputtering with a sputtering gas having a flow rate of $N_2$ which is 30% or more compared to a total flow rate of the sputtering gas,
wherein the phase shift film comprises molybdenum;
wherein the phase shift film has a transmittance of 4 to 8% for ArF light,
wherein the phase shift film comprises a phase difference adjustment layer comprising a surface containing nitrogen and the molybdenum in a uniform mixture in the in-plane direction of the surface, and wherein a Photon energy of incident light in a point having a Del_2 value of 0 according to Equation 3 below is 3.8 eV to 4.64 eV, when $PE_1$ value is 3.0 eV and $PE_2$ value is 5.0 eV;

$$Del\_2 = \lim_{\Delta PE \to 0}\left(\frac{\Delta DPS}{\Delta PE}\right) \qquad \text{[Equation 3]}$$

where in the Equation 3,
the DPS value is, when the light shielding film is removed from the blank mask and after that the surface of the phase shift film is measured with a spectroscopic ellipsometer by applying an incident angle to be 64.5°, the phase difference between P wave and S wave of reflected light if the phase difference between the P wave and the S wave of the reflected light is 180° or less, or a value of subtracting the phase difference between the P wave and the S wave of the reflected light from 360° if the phase difference between the P wave and the S wave of the reflected light is more than 180°, and
the PE value is the Photon energy of incident light within a range of the $PE_1$ value to the $PE_2$ value.

9. The blank mask of claim 8,
wherein a Photon energy of incident light in a point having the Del_2 value of 0 is 1.8 to 2.14 eV, when the $PE_1$ value is 1.5 eV and the $PE_2$ value is 3.0 eV.

10. The blank mask of claim 8,
wherein an average value of the Del_2 value is 78 to 98/eV, when the $PE_1$ value is 1.5 eV and the $PE_2$ value is the minimum value within Photon energy values of incident light in a point having the Del_2 value of 0.

11. The blank mask of claim 8,
wherein an average value of the Del_2 value is −65 to −55/eV, when the $PE_1$ value is the minimum value within Photon energy values of incident light in a point having the Del_2 value of 0, and the $PE_2$ value is the maximum value within Photon energy values of the incident light in a point having the Del_2 value of 0.

12. The blank mask of claim 8,
wherein an average value of the Del_2 value is 60 to 120°/eV, when the $PE_1$ value is the maximum value within Photon energy values of incident light in a point having the Del_2 value of 0, and when the $PE_2$ value is 5.0 eV.

13. The blank mask of claim 8,
wherein the maximum value of the Del_2 value is 105 to 300°/eV, when the $PE_1$ value is 1.5 eV and the $PE_2$ value is 5.0 eV.

14. The blank mask of claim 13,
wherein the Photon energy in a point having the maximum value of the Del_2 value is 4.5 eV or more.

15. A photomask comprising:
a transparent substrate;
a phase shift pattern film disposed on the transparent substrate; and
a light shielding pattern film, consisting of a lower layer and an upper layer of CrN, with the lower layer disposed on the phase shift pattern film;
wherein the lower layer of the light shielding pattern film comprises oxygen in an amount of 25 to 40 atom %,
wherein the upper layer of the light shielding film is formed by sputtering with a sputtering gas having a flow rate of $N_2$ which is 30% or more compared to a total flow rate of the sputtering gas, wherein the phase shift film has a transmittance of 4 to 8% for ArF light, wherein the phase shift film comprises a phase difference adjustment layer comprising a surface containing nitrogen and the molybdenum in a uniform mixture in the in-plane direction of the surface, and wherein the phase shift film comprises molybdenum;

wherein a TFT3 value expressed by Equation 4 below is 0.25 μm/100° C. or less;

$$TFT3 = \frac{\Delta pPM}{T2 - T1} \quad \text{[Equation 4]}$$

where, when the thermal variation of the processed photomask, which is formed by processing the thickness of the transparent substrate to be 0.6 mm and removing the light shielding pattern film, is analyzed in a thermomechanical analyzer, the measuring temperature of the thermomechanical analyzer is increased from the T1 to the T2, and the ΔpPM is a position change of the upper surface of the phase shift pattern film in the thickness direction at the T2 based on a position of the upper surface of the phase shift pattern film at the T1.

* * * * *